(12) United States Patent
Kamen et al.

(10) Patent No.: US 9,936,596 B2
(45) Date of Patent: Apr. 3, 2018

(54) APPARATUS, SYSTEM AND METHOD FOR RESOURCE DISTRIBUTION

(71) Applicant: DEKA Products Limited Partnership, Manchester, NH (US)

(72) Inventors: Dean Kamen, Bedford, NH (US); Matthew A. Norris, Londonderry, NH (US)

(73) Assignee: DEKA Products Limited Partnership, Manchester, NH (US)

( * ) Notice: Subject to any disclaimer, the term of this patent is extended or adjusted under 35 U.S.C. 154(b) by 0 days.

(21) Appl. No.: 13/793,552

(22) Filed: Mar. 11, 2013

(65) Prior Publication Data

US 2014/0078652 A1    Mar. 20, 2014

Related U.S. Application Data

(60) Provisional application No. 61/703,015, filed on Sep. 19, 2012.

(51) Int. Cl.
| | |
|---|---|
| *E04H 1/00* | (2006.01) |
| *E04H 3/00* | (2006.01) |
| *E04H 5/00* | (2006.01) |
| *E04H 6/00* | (2006.01) |
| *E04H 9/00* | (2006.01) |
| *E04H 14/00* | (2006.01) |
| *H05K 7/00* | (2006.01) |

(52) U.S. Cl.
CPC ............... *H05K 7/00* (2013.01); *E04H 9/00* (2013.01)

(58) Field of Classification Search
CPC .... E04B 1/34331; E04B 1/34869; E04B 1/35; E04B 2001/34389; E04H 1/1205; E04H 2001/1283; E04H 9/00; H05K 7/00
USPC ............ 52/79.1, 79.5, 79.7, 68, 36.2, 169.6
See application file for complete search history.

(56) References Cited

U.S. PATENT DOCUMENTS

| | | | | |
|---|---|---|---|---|
| 4,257,397 | A | * | 3/1981 | Gouyou-Beauchamps ....... F24D 17/0068 126/587 |
| 4,601,509 | A | * | 7/1986 | Ellis, Sr. .......................... 296/22 |
| 4,644,935 | A | * | 2/1987 | Gallagher ........... F24D 19/1057 126/588 |
| 5,285,604 | A | * | 2/1994 | Carlin ............................ 52/79.1 |
| 5,727,353 | A | * | 3/1998 | Getz et al. ..................... 52/79.1 |
| 5,775,043 | A | * | 7/1998 | Muroi ................... E02D 29/045 414/244 |
| 5,775,758 | A | * | 7/1998 | Eberspacher .............. 296/24.38 |
| 6,131,349 | A | * | 10/2000 | Hill ................................. 52/292 |
| 7,326,355 | B2 | * | 2/2008 | Graetz et al. ................. 210/806 |
| 8,291,648 | B1 | * | 10/2012 | Orr ................................... 52/86 |
| 2002/0189173 | A1 | * | 12/2002 | Staschik ........................ 52/79.1 |
| 2004/0144089 | A1 | * | 7/2004 | Kamen et al. .................. 60/524 |
| 2005/0138867 | A1 | * | 6/2005 | Zhao ......................... E04H 1/04 52/79.1 |
| 2007/0208598 | A1 | * | 9/2007 | McGrady et al. ................ 705/3 |
| 2008/0133181 | A1 | * | 6/2008 | Kamen et al. ................ 702/188 |
| 2008/0313973 | A1 | * | 12/2008 | Butler Rolf ..................... 52/79.1 |
| 2008/0314356 | A1 | * | 12/2008 | Kamen et al. ............. 123/197.3 |
| 2009/0223143 | A1 | * | 9/2009 | Esposito ......................... 52/79.1 |

(Continued)

*Primary Examiner* — Brian D Mattei
(74) *Attorney, Agent, or Firm* — Michelle Saquet Temple

(57) ABSTRACT

A system for the distribution of resources. The system includes a housing including at least one water vapor distillation device, at least one power generating device, at least one source water reservoir, at least one product water reservoir, and at least one energy storage device.

19 Claims, 27 Drawing Sheets

(56) References Cited

U.S. PATENT DOCUMENTS

| | | | |
|---|---|---|---|
| 2010/0089378 A1* | 4/2010 | Babington et al. | 126/21 R |
| 2010/0195991 A1* | 8/2010 | Deivasigamani | F24D 17/0026 |
| | | | 392/308 |
| 2010/0205870 A1* | 8/2010 | Cobb | 52/79.1 |
| 2011/0041415 A1* | 2/2011 | Esposito | 52/12 |
| 2011/0173898 A1* | 7/2011 | Denicourt et al. | 52/79.1 |

* cited by examiner

US 9,936,596 B2

APPARATUS, SYSTEM AND METHOD FOR RESOURCE DISTRIBUTION

CROSS REFERENCE TO RELATED APPLICATIONS

The present application is a Non-Provisional Application which claims the benefit of U.S. Provisional Patent Application Ser. No. 61/703,015, filed Sep. 19, 2012 and entitled Apparatus, System and Method for Resource Distribution, which is hereby incorporated herein by reference in its entirety.

FIELD OF INVENTION

The present disclosure relates to resource distribution. More particularly, the present disclosure relates to an apparatus, system and method for resource distribution.

BACKGROUND

Dependable access to the resources necessary to sustain life and foster prosperity eludes vast portions of humanity. Even in well developed areas of the world, natural disasters have demonstrated such access can be erased in little time at all. In some instances, e.g. military operations, the ability to easily create this access is extremely important.

According to the Canadian International Development Agency, about 1.2 billion people lack access to safe drinking water. The UN reports that a full 1.6 billion people lack electricity. Again, according to the UN, nearly one billion people lack access to the most basic of health services and about 3 times that number live on less than two dollars per day. Reports attribute tens of millions of deaths each year to entirely preventable water related diseases alone. Sadly, many of these deaths are children. Illness caused by water related disease affects even more and often leads to missed schooling and work. By improving dependable access to life sustaining and prosperity fostering resources the well being of billions of people throughout the world could be improved. Moreover, these people would be enabled to contribute trillions of dollars to the global economy every year.

Many means of providing such access are well known, however, these means are significantly obstructed in situations where infrastructure is either minimal or has been destroyed. Some solutions to these problems require large numbers of consumables such as filters and chemicals which can be costly and are hard to import into an isolated location. Some require highly skilled operators or constant maintenance by a trained technician. Others only address, for example, the water quality or medical aspect of the problem. Additionally, known solutions do not offer the dependent population a way to foster economic activity. Known solutions are also not easily adaptable to the differing needs of different areas, populations, or situations. Another issue with existing solutions is that they rely on donated funding and are therefore limited. Many solutions provide free services which in effect may actually stifle economic growth because a local entrepreneur who desires to offer such services will not be able to compete with the free nature of the services.

The ability to provide these necessary resources from a single locus without the need for large quantities of consumables or skilled staff while at the same time providing a hub for economic activity is, accordingly, acutely desirable. Additionally desirable is the ability to easily tailor such a locus to the needs of any given area, population, or scenario. Ideally such a solution should be self sustainable and economically profitable at the local, regional, and global level.

SUMMARY

In accordance with an embodiment of the present disclosure, a system for the distribution of resources is disclosed. The system includes a housing including at least one water vapor distillation device, at least one power generating device, at least one source water reservoir, at least one product water reservoir, and at least one energy storage device.

Some embodiments of this aspect of the invention include one or more of the following. Wherein the at least one power generating device is a Stirling generator. Wherein the at least one power generating device is a solar power generating device. Wherein the system for the distribution of resources further comprising a refrigerator. Wherein the refrigerator includes a general section, and a medical refrigeration section, the medical refrigeration section segregated from the rest of the general section. Wherein the system further including at least one oven. Wherein the oven is heated by waste heat from the power generating element. Wherein the housing comprising a shipping container. Wherein the at least one energy storage device is a fuel storage tank. Wherein the at least one energy storage device is a battery bank. Wherein the power generating device supplies power to an electrical grid. Wherein the system includes at least one communications tower. Wherein the system further includes a charging station configured to charge at least one portable power source.

In accordance with an embodiment of the present disclosure, a system for the distribution of resources is disclosed. The system includes a housing including a first compartment, the first compartment including at least one water vapor distillation device, the water vapor distillation device in fluid communication with a source water reservoir and a product water reservoir, a second compartment, the second compartment including at least one fuel requiring element providing electrical power to the at least one water vapor distillation device, at least one refrigeration apparatus, at least one oven, wherein the at least one oven connected to the fuel requiring element wherein the waste heat from the fuel requiring element is transferred to the at least one oven, and a fuel reservoir in fluid communication with the fuel requiring element.

Some embodiments of this aspect of the invention include one or more of the following. Wherein the at least one fuel requiring element is a Stirling generator. Wherein the system further includes at least one energy storage device. Wherein the at least one energy storage device is a battery bank. Wherein the system further includes at least one solar panel. Wherein the system for the distribution of resources further includes at least one communications tower. Wherein the system further includes a charging station configured to charge at least one portable power source.

In accordance with an embodiment of the present disclosure, a system for the distribution of resources is disclosed. The system includes a housing including at least one water vapor distillation apparatus, at least one power generating device, at least one source water tank, at least one product water tank, and at least one fuel tank.

In accordance with an embodiment of the present disclosure there is a kiosk for the distribution of resources. The kiosk may be used in many situations and locations, including, but not limited to, in emergency/disaster relief applications, military applications, and/or as an entrepreneurial micro-business. In some embodiments, the kiosk includes a water purification device. The water purification device is fluidly connected to a source water reservoir and a product water reservoir. The kiosk also includes at least one refrigeration apparatus. Some embodiments of the refrigeration apparatus includes at least one compartment. The kiosk also includes at least one heating element. The kiosk also includes a fuel requiring element and fuel reservoir connected to the fuel requiring element. The fuel requiring element provides power to at least the water purification device and the at least one refrigerator.

In accordance with other embodiments of the kiosk, the kiosk includes a water purification device which is a vapor compression water distillation device. In some embodiments at least one of the refrigerators includes a medical refrigeration compartment/section. In some embodiments the power generating element powering at least the water purification device and at least one refrigerator is a Stirling engine generator. In some embodiments, the power generating element may also power one or more other devices. Other devices may include, but are not limited to, one or more of the following: a TV, speakers serving as the audio output of the TV, lighting, at least one computer, a cellular communications tower, a charging station for chargeable devices, and an electrical mini-grid. In some embodiments, at least the TV screen is protected by a transparent panel which may be, in some embodiments, a ½" thick polycarbonate panel, however, in other embodiments, the thickness of the panel and/or the material the panel is made from may vary. In embodiments including a computer, the computer may be connected to the internet. In some embodiments, the kiosk may include at least one heating element. In some embodiments, the heating elements may be an oven. In these embodiments, the oven may be heated with the waste heat of the power generating element and may include a means for controlling the flow of waste heat to the oven. Some embodiments also include a teaching area and/or a medical clinic In some embodiments the kiosk includes a housing. In some embodiments, the housing is a shipping container. Some embodiments of the housing may include, but are not limited to, one or more of the following characteristics/ functions/elements: at least one door, water tight, and ventilation.

In accordance with some embodiments, the kiosk may include, but is not limited to, one or more of the following: a means to fill the source water reservoir; a means to dispense product water from the product water reservoir; a spigot to dispense product water from the product water reservoir; at least one refrigerator comprising at least one cooled product water reservoir, and a component with a monetarily operated mechanism.

These and other aspects of the disclosure are not meant to be exclusive and other features, aspects, and advantages of the present disclosure will be readily apparent to those of ordinary skill in the art when read in conjunction with the appended claims and accompanying drawings.

BRIEF DESCRIPTION OF THE DRAWINGS

These and other aspects will become more apparent from the following detailed description of the various embodiments of the present disclosure with reference to the drawings wherein.

Like reference symbols in the various drawings indicate like elements.

DETAILED DESCRIPTION

Figure 1:
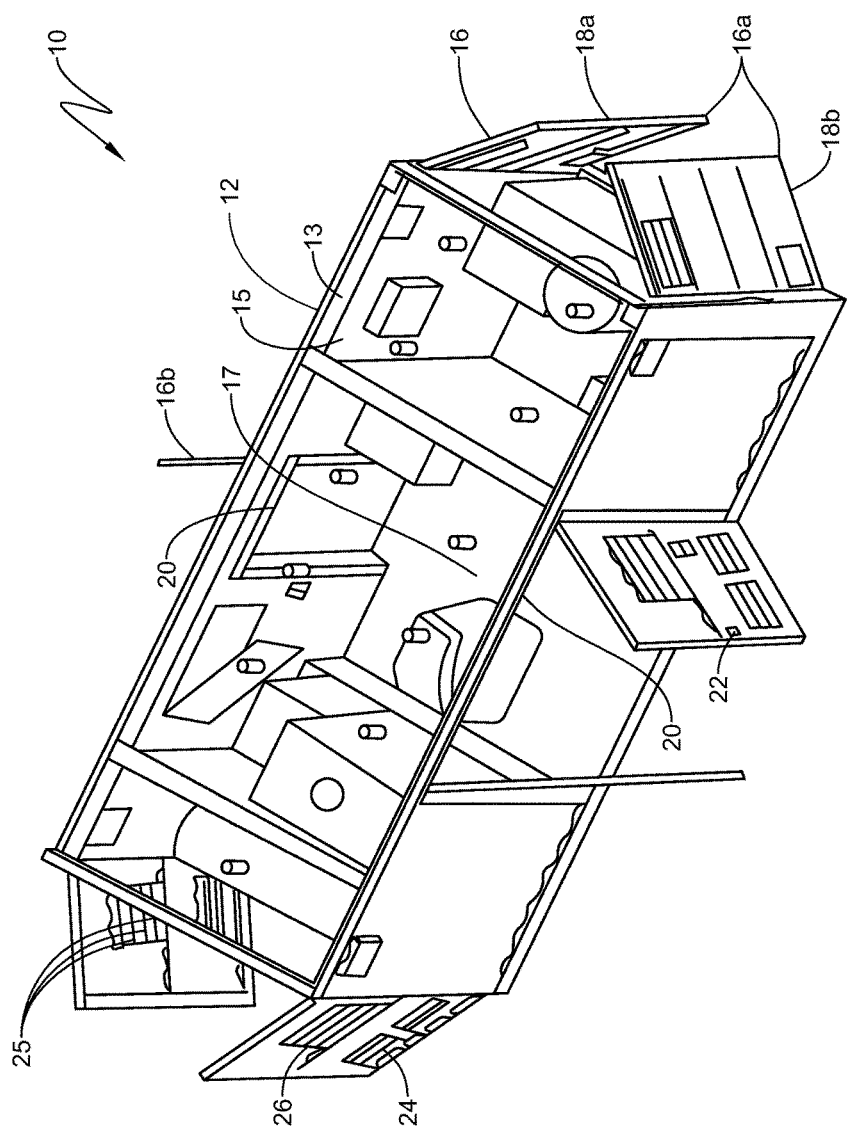
FIG. 1 is a view of an example of a kiosk for resource distribution in accordance with an embodiment of the present disclosure.

Referring now to FIG. 1, an example embodiment of an apparatus for resource distribution 10 is depicted. The term "kiosk" may be used throughout to refer to one or more embodiments of the apparatus and system. The kiosk for resource distribution 10 may be used to provide a large range of resources, service, etc. to a surrounding population. Additionally, the kiosk for resource distribution 10 may include a number of shared elements, components, resource, etc. in close proximity to one another. In some embodiments, the elements, components, resources, etc. within the kiosk for resource distribution 10 may leverage off one another and work in a symbiotic relationship with one another. This may allow for expanded functionality, capabilities, usage, and improved overall efficiency of the kiosk for resource distribution 10.

The example kiosk for resource distribution 10 in FIG. 1 includes a housing 12. In the embodiments illustrated in, for example, FIGS. 1-3, the housing 12 is shown as a shipping container. However, in various other embodiments, the housing 12 may not be a shipping container and therefore may include proportions that are different than those shown herein. In addition, in various embodiments where the kiosk 10 housing 12 is a shipping container, the shipping container may be any sized shipping container. In some embodiments, including, for example, the embodiments shown in FIGS. 1-3, the container may be a 20'×8'×8' steel shipping container weighing approximately 4000 lbs. In alternate embodiments, any other variety of shipping containers may be used, for example, a 10×8×8 shipping container. In some embodiments the housing 12 may be any number of shipping containers of any suitable size or sizes. Referring now also to FIGS. 6-10, as shown the housing 12 may also include any other suitable structure such as, but not limited to, a vehicle, building, veranda, pavilion, gazebo, or the like. In some embodiments, the housing 12 may be water tight or made water tight for shipping, inclement weather, or any other occasion where a water tight housing 12 may be desirable.

In various embodiments, the housing may include insulation 13. The insulation 13 may be added for temperature moderation purposes. In some embodiments, the insulation 13 may be disposed about all interior surfaces of the housing 12 including the doors 16 (described in greater detail below). In some embodiments, the insulation 13 may be about 3.5 inch thick closed cell spray foam with an R-21 insulation factor. Other embodiments may use other types of insulation which may have differing R factors. In some embodiments, the insulation 13 may also exist in any desirable thickness. In some embodiments, the insulation 13 may be made of recycled materials. In various embodiments, the insulation 13 may have one or more other desirable qualities, which include, but are not limited to, one or more of the following: sound reducing qualities. In some embodiments where noise levels may be a consideration, the housing 12 may also be fitted with soundproofing (not shown).

In some embodiments, the interior of the housing 12 may include a wall material 15. In embodiments where the housing 12 includes insulation 13, the wall material 15 may cover the insulation 13. The wall material 15 may be any suitable wall material 15, such as, but not limited to, drywall, cement board, tile, metal, plastic or plywood. Plywood or plastic may be desirable for a number of reasons, including, but not limited to, use of plywood or plastic as a wall material 15 allows easy customization and modification of the housing 12 interior.

The housing 12 may also include flooring 17 which covers the floor portion of the interior of the housing 12. The flooring 17 may be made of any of a variety of materials including, but not limited to wooden boards or planks, metal, tile, ceramic, carpet, laminate, vinyl, plywood, plastic, metal, etc. In an exemplary embodiment of the housing 12, the flooring 17 may be made from about 1" thick plywood panels. In some embodiments, one or more different types of flooring 17 may be used within the housing 12.

The housing 12 may also include one or more, or a plurality of doors 16. The one or more doors 16 may be situated anywhere on the housing 12. In the embodiment depicted in FIG. 1, the one or more doors 16 are located generally in the center of the long sides of the housing 12 and, additionally, each of the ends of the housing 12 include doors 16. Some embodiments may only include doors 16 on one end of the housing 12. In various embodiments, the door(s) 16 may take any of a variety of forms.

In the embodiment shown in FIG. 1, three of the doors 16 are barn-style doors 16a. The barn-style doors 16a may be located on both ends of the housing 12 and on one of the long sides of the housing 12. Some embodiments of the barn-style doors 16a include a right panel 18a and a left panel 18b (directions given refer to orientations depicted in figure being discussed). The panels 18a and 18b are pivotally coupled to their respective right and left vertical spans of the door frame 20. The barn-style doors 16a may swing from a closed position to an open position. In the closed position (not shown) the right 18a and left 18b panels of the barn-style door 16a are fully pivoted toward the vertical centerline of the plane of the door frame 20. In this position, the barn-style doors 16a cover the opening to the inside of the housing 12 and preclude an individual from gaining entry to the interior of the housing 12. In the open position (not shown) the right 18a and left 18b panels of the barn-style door 16a may be pivoted substantially a full 180° from their closed position. In this position, the panels 18a and 18b do not obstruct entry to the housing 12. As shown in FIG. 1 the panels 18a and 18b of the barn-style doors 16a may also be pivoted to a location somewhere between the fully open and fully closed position.

Still referring to FIGS. 1-6, the barn-style doors 16a may additionally include a latch/lock mechanism 22. In some embodiments the latch/lock 22 may be a padlock or a dead bolt. Some embodiments may include any of a variety of other types of latch/lock mechanisms 22, such as, but not limited to, combination locks, pin/wafer/disc-tumbler locks, lever lock, tubular locks, etc. In various embodiments, the latch/lock 22 may also be any of a number of electronic locks or smart locks such as a keycard lock, keypad lock, RFID lock, etc. The latch/lock 22 may also be timed such that it will only open during business hours of the kiosk for resource distribution 10. In some embodiments, the door(s) 16 may include a combination of two or more different latch/lock mechanisms 22.

As in the embodiment shown in FIG. 1, the housing 12 may also have at least one generally conventional, single-leaf door 16*b*. As shown in FIG. 1, the single-leaf door 16*b* may be disposed on the long, back side of the housing 12. The single-leaf door 16*b* may be pivotally coupled to the housing 12 on either its right or left side. However, in various embodiments, at least one single-leaf door 16*b* may be located anywhere on the housing 12. The single-leaf door 16*b* may pivot between an open and closed position. In the closed position (not shown) the single-leaf door 16*b* completely obstructs the entry opening and prevents entry to the inside of the housing 12. In the fully open position, the single-leaf door 16*b* is pivoted substantially 180° from the closed position. In the open position, in some embodiments, the single-leaf door 16*b* generally rests against the exterior side of the housing 12 and unimpeded entry to the interior of the housing 12 is allowed.

Still referring to FIGS. 1-6, the single-leaf door 16*b* may additionally include one or more latch or locking mechanism 22. In an exemplary embodiment the latch/lock 22 may be a padlock or a dead bolt. Other embodiments may use any one or more of a variety of other types of latch/lock mechanisms 22, such as, but not limited to, combination locks, pin/wafer/disc-tumbler locks, lever locks, tubular locks, etc. In various embodiments, the latch/lock 22 may also be any of a number of electronic locks or smart locks such as a keycard lock, keypad lock, RFID lock, etc. In some embodiments, the latch/lock 22 may also be timed such that it will only open during business hours of the kiosk for resource distribution 10. In some embodiments, the door(s) 16 may include a combination of two or more different latch/lock mechanisms 22.

In the exemplary embodiment, the doors 16 are made of steel, however, in various other embodiments, the doors 16 may be made from different materials. Additionally, in some embodiments, every door 16 except one may be locked from the inside. This may be desirable for many reasons, including, but not limited to, security for the kiosk for resource distribution 10. However, in various other embodiments, more than one door 16 may be locked/unlocked from the outside.

Still referring to FIGS. 1-6. in some embodiments, there may be additional doors 16. Some embodiments may forgo some of the doors 16 described above. Moreover, alternative embodiments may have a greater number of barn-style doors 16*a* or a greater number of single-leaf type doors 16*b*. Some embodiments may only include barn-style doors 16*a* while still other embodiments may include only single-leaf type doors 16*b*. Embodiments may also use doors 16 of any number of varieties including those which may not be described herein. For example, some embodiments may include, but are not limited to, one or more of the following: bi-fold doors, roll up doors; garage type doors, sliding doors, etc. In some embodiments, one or more of the doors 16 may be top-hinged doors which may have the ability to be flipped up onto the roof of the housing 12. In some embodiments, the vertical side panels of the housing 12 may be removably coupled to the housing 12 such that the panels may be removed to provide access to the interior of the housing 12. In some embodiments the vertical panels of the housing 12 may be hingedly coupled to the housing such that they may be pivoted to expose the interior of the housing 12.

Figure 9:
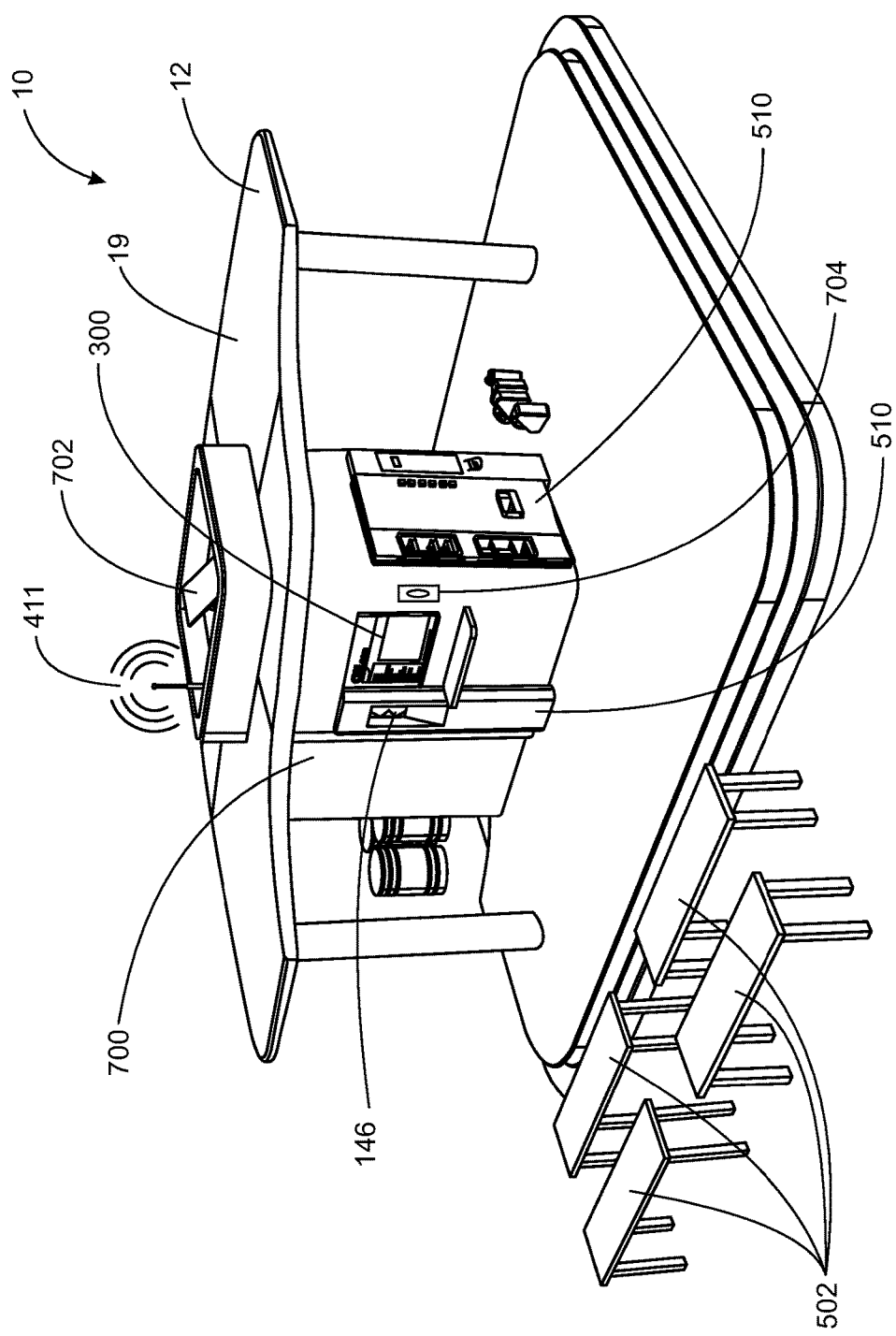
FIG. 9 is a view of another example of a kiosk for resource distribution in accordance with an embodiment of the present disclosure.

In some embodiments, the housing 12 may be provided with one or more awnings 19 (some embodiments illustrated in FIG. 9). The awning 19 may be permanently or removably coupled to the housing 12. In some embodiments, the awning 19 may also be of the retractable, roll-out, swing-out, pop-up, etc. type. In some embodiments the awning 19 may be manually operated, while in other embodiments, the awning 19 may be electrically powered. The awning 19 may be made from any of an assortment of different materials, including, although not limited to, fabric (cloth, canvas, etc.), aluminum, sheet metal, fiberglass, polycarbonate, etc. Additionally, in various embodiments, at least one door 16 may be pivotally coupled to the housing 12, such that it may be pivoted and locked in a position where it functions as the awning 19.

In some embodiments, the housing 12 may include one or more mechanisms/apparatus/systems of ventilation. Various embodiments of ventilation are described herein. In various embodiments, one or more types of ventilation systems described herein may be included. In various embodiments, additional systems not described herein may be included. As shown in FIG. 1, in some embodiments, ventilation may be provided by a cross breeze created when the single-leaf door 16*b* and barn type door 16*a* opposite the single-leaf door 16*b* are opened. In some embodiments, light colored, or heat reflective paint may be employed to aid in reducing heat loading of the kiosk for resource distribution 10.

Referring still to FIGS. 1-6, the door(s) 16 may comprise one or more, or a plurality of vents 24. Vents 24 may also be positioned elsewhere along the sides of the housing 12. One or more vents 24 may also be disposed on the ceiling/roof of the housing 12. In some embodiments, the vents 24 may be cut into the housing 12 using, for example, a plasma cutter. In some embodiments, the vents 24 may be formed as a part of the housing 12 during manufacture or construction of the housing 12. The vents 24 contribute to ventilation of the kiosk for resource distribution 10.

In some embodiments, the vents 24 may comprise a number of slats 25 which are arrayed within a polygonal orifice 26. In some embodiments, the polygonal orifice 26 may not be polygonal 26, but rather round. In the exemplary embodiment shown, the vents 24 are louvered so that orientation of the slats 25 may be adjusted by a user. This enables the user to control ventilation of the kiosk for resource distribution 10. The vent(s) 24 may also include a gasket (not shown). The gasket may be of any of a variety of materials, for instance silicone. In other embodiments, the gasket may be made from different materials. The vent(s) 24 may also be snow/water proof.

In various embodiments, the vent(s) 24 may include an exterior screen, interior screen, or both (none shown). The exterior screen and interior screen may be mesh screens. In some embodiments, the exterior screen may comprise a larger mesh relative to the interior screen. In such embodiments, the exterior screen may serve as a security precaution while the interior screen may prevent bugs and debris from entering the housing 12. Additionally, the vent(s) 24 may include a plug (not shown). The plug may be removably coupled to a vent 24 such that the polygonal orifice 26 is covered. The plug 32 may be desirable for a many reasons, including, but not limited to, increased security of the kiosk for resource distribution 10, plugging the vents 24 during shipping or inclement weather, making the housing 12 water tight, etc. The plug may be made from any number of materials, including, but not limited to, metal, wood, polycarbonate, plastic, etc.

The interior of the housing 12 of the kiosk for resource distribution 10 may be divided into a number of different segments or compartments. In some embodiments, the housing 12 may be a single open space and may not include partitioned/sectioned areas. Referring still to FIGS. 1-6, these FIGS. depicts one of many possible ways that this may be done in embodiments where the housing 12 is a shipping container. The configuration shown in FIGS. 1-6 are non-limiting examples. The number, type, size, shape, location, usage, etc. of segments, compartments, or elements of the kiosk for resource distribution 10 may vary in various embodiments. Likewise, in embodiments where the housing 12 is not a shipping container, elements included within the various embodiments of the kiosk for resource distribution 10 may be set up and/or configured in any number of arrangements.

As shown in FIGS. 1-6, in some embodiments, one side of the housing 12 may be cordoned off into a storage area 100. The storage area 100 may be sectioned off by a partitioning wall 101 running in a plane substantially perpendicular to the long sides of the housing 12. In other embodiments, the partitioning wall 101 may be bent, curved, etc. to better suit the storage needs of the kiosk for resource distribution 10. The partition wall 101 may be made of a number of different materials, including, but not limited to plywood, etc. The storage area 100 may be used to store any number of items. Additionally, in some embodiments there may be a plurality of storage areas 100. The storage area 100, is used to store fuel for a fuel requiring element 102, which, in some embodiments may be a Stirling engine power generator, for example, any one or more of the embodiments of Stirling engines described in U.S. patent application Ser. No. 12/829,320, filed Jul. 1, 2010 and entitled Stirling Cycle Machine, now U.S. Published Application No. US-2011-0011078-A1, published Jan. 20, 2011, which is hereby incorporated herein by reference in its entirety. Other embodiments may include other fuel requiring elements 102 or multiple fuel requiring elements 102.

In some embodiments, the fuel may be propane. In other embodiments, the fuel may be a different fuel, such as but not limited to, diesel, kerosene, biofuel, other natural gases, etc. In an exemplary embodiment, the fuel is stored in a fuel storage tank 104, specifically an 8'×5', 275 gallon fuel storage tank 104. In alternate embodiments, the fuel storage tank 104 may have different dimensions and capacity. Additionally, there may be a plurality of fuel storage tanks 104. In embodiments where there is a plurality of fuel storage tanks 104, some of the fuel storage tanks 104 may contain one fuel, while other fuel storage tanks 104 may contain other, different types of fuel. The fuel storage tanks may have an opening 106 to allow for the filling of the fuel storage tanks 104. The opening 106 may be accessible from the exterior of the housing 12. In other embodiments, the opening 106 may only be accessed from the interior of the housing 12. This may be desirable for many reasons, including, but not limited to, security reasons as it may prevent tampering with and/or siphoning from the fuel storage tanks 104. In embodiments with a Stirling engine power generator, the fuel may be contaminated (e.g. by adding water) such that it is rendered useless for use in an internal combustion engine. This may also help to prevent tampering with and/or stealing from the fuel storage tanks 104. In some embodiments, at least one fuel storage tank 104 may be disposed outside of the housing 12. This may be particularly desired if the fuel storage tank 104 is storing propane.

In various embodiments, the fuel storage tanks 104 additionally include a connector to the fuel requiring element 102. In embodiments where there are a plurality of fuel storage tanks 104 the connector may be easily changed such that the fuel requiring element 102 may be interchangeably connected to any of the plurality of fuel storage tanks 104. In some embodiments, for example, in embodiments where the fuel requiring element 102 is a Stirling engine power generator, the fuel requiring element 102 may be run from any of a variety of fuels.

Still referring to FIGS. 1-6, the storage area 100 may also be used for any of a number of other purposes. For a non-limiting example, the storage area 100 may be used for other storage purposes. In some embodiments, the storage area 100 may be used to store materials for a library such as books or other media. The storage area 100 may also function as the mail room in embodiments where at least one of the functions of the kiosk for resource distribution 10 is a post office. In some embodiments, the storage area 100 may provide a secure storage location for the surrounding population. For example, the storage area 100 may include safety deposit boxes (not shown). In some embodiments, the storage area 100 may for example be the vault of a bank. In yet other embodiments of the kiosk for resource distribution 10, the storage area 100 may be the holding cell of a jail or record storage for a municipal office. The storage area 100 may be used to store consumables, commodities, or commercial products for an entrepreneurial business. The storage area 100 may be used to store arms or other military hardware in military applications.

Still referring to FIGS. 1-6, in some embodiments, the housing 12 may include a second section of the interior. A second section of the interior of the housing 12, may be a middle compartment 120. The middle compartment 120 may be defined by the partitioning wall 101 of the storage area 100 and a second partitioning wall 121. The second partitioning wall 121 may run substantially parallel to the first partitioning wall 101 as it does in the embodiment illustrated in FIG. 2. Additionally, the second partitioning wall 121, may be offset from the first partitioning wall 101 by a distance in a direction substantially perpendicular to the plane of the first partitioning wall 101. Similar to the first partitioning wall 101, the second partitioning wall 121 may be curved, bent, etc. to better accommodate the needs of the kiosk for resource distribution 10. The first partition wall 101 and second partition wall 121 may be made of a number of different materials, including, but not limited to plywood, etc.

In some embodiments, the middle compartment 120 may be arranged as the distribution section of the kiosk for resource distribution 10. In embodiments where the kiosk for resource distribution 10 is so arranged, the middle compartment 120 may be manned by one or more individuals. In embodiments where the kiosk for resource distribution 10 is being used as an entrepreneurial micro-business, the middle compartment 120 may be manned by one or more entrepreneurs or their employee(s). In other embodiments where the kiosk for resource distribution 10 is being used in emergency relief applications, the middle compartment 120 may be staffed by one or more aid worker or the like. In various embodiments where the kiosk for resource distribution 10 is being utilized in a military application, the middle compartment 120 may be manned by one or more service members. In still other embodiments, the middle compartment 120 may be unmanned, automated, etc.

The middle compartment 120 may include one or more components. In the non-limiting embodiment shown in FIGS. 1-6, the middle compartment 120 includes at least one water distillation device 122. The water distillation device(s) 122 may be a water vapor distillation apparatus which may, in some embodiments, be similar to the one described in U.S. patent application Ser. No. 13/184,169, filed Jul. 15, 2011 and entitled Water Vapor Distillation Apparatus, Method and System, now U.S. Published Application No. US-2011-0011078-A1, published Jan. 12, 2012, which is hereby incorporated herein by reference in its entirety. In various embodiments, other water distillation devices 122 may be used. In some embodiments, other varieties of water devices including distillation and/or purification devices could be used in conjunction with or in place of a water distillation device 122. Some embodiments may not include a water device or water distillation device 122.

In the embodiments shown, the water distillation device 122 is fed by a source water reservoir 124. The source water reservoir 124 may be a rigid structure such as a tank. The source water reservoir 124 may also be a bulge in the floor, wall, or ceiling of the housing 12 or in either the first partitioning wall 101 or second partitioning wall 121. The source water reservoir 124 may also be disposed beneath the floor or on the roof of the housing 12. In an exemplary embodiment, the source water reservoir 124 is a deformable structure, specifically a 300 gallon bladder. However, the size of the bladder may vary in various embodiments. In the exemplary embodiment, the source water reservoir 124 may be disposed on the floor of the middle compartment 120 adjacent to the first partitioning wall 101. In some embodiments, the source water reservoir 124 may be located in both the storage area 100 and the middle compartment 120. In some embodiments, the source water reservoir 124 may be disposed about the floor of the storage area 100 and a portion of the middle compartment 120. In various other embodiments, the source water reservoir 124 may be located elsewhere within the housing 12. In some embodiments the source water reservoir 124 may be located on the roof of the housing 12. In other embodiments, the source water reservoir 124 may be located external to the housing 12. Moreover, alternate embodiments may have a plurality of source water reservoirs 124. In embodiments where there are a plurality of source water reservoirs 124, there may be at least one source water reservoir 124 inside the housing 12 and at least one source water reservoir 124 outside of the housing 12. In other embodiments all source water reservoirs 124 may be located either within the interior of the housing 12 or outside of the housing 12. Furthermore, in embodiments with multiple source water reservoirs 124, the source water reservoirs 124 may come in a variety of types (tank, bladder, etc.) or may all be of the same type.

Still referring to FIGS. 1-6, the at least one source water reservoir 124 may be encased by a case 126. The case 126 protects the reservoir from damage and also creates a platform or shelf on which other components of the kiosk for resource distribution 10 may be placed. The case 126 may be made from any of a variety of materials including steel, other metals, plastic, wood, or preferably plywood. In some embodiments, the case 126 may include insulation to mitigate potential of the source water reservoir 124 freezing. Additionally, in some embodiments, a mechanism may be provided to treat water in the source water reservoir 124 with an additive, such as antifreeze, to prevent freezing. In some embodiments, the mechanism may be an automatic mechanism and in some embodiments, the mechanism may include an access area to the source water to manually add the additive. In some embodiments, water in the source water reservoir 124 may be prevent from freezing by means of a thermal heat source which may, for example, be an electric heater 180.

Still referring to FIGS. 1-6, the at least one source water reservoir 124 also includes a mechanism to fill the source water reservoir 124. The source water reservoir 124 may be coupled to a source water conduit 128 which facilitates external filling of the at least one source water reservoir 124. The source water conduit 128 may be in fluid communication with a source water pump 130. In some embodiments, the source water pump 130 may be deployed into/onto a water body 129, including, but not limited to, a pond, a lake, a river, a stream, a puddle, well, the ocean, etc. When the source water pump 130 is running, the source water pump 130 pumps water through the source water conduit 128 and into the source water reservoir 124. In some embodiments, the source water reservoir 124 may include an overfill snorkel (not shown) which prevents overfilling or bursting of the source water reservoir 124. In some embodiments, the source water reservoir 124 may include a vent that vents air out of the source water reservoir 124. In some embodiments, the vent may be connected to a line that may extend upwards about six feet (or in other embodiments, less than or greater than 6 feet) from the source water reservoir 124.

The source water pump 130 may be a submersion pump in some embodiments. In embodiments where the source water pump 130 is a submersion pump, the source water pump 130 may be fitted with a floatation material which keeps the source water pump suspended in the middle of the water column. Additionally, the source water pump 130 may include an anchor which is capable of keeping the source water pump 130 in a desired location in/on a water body 129. In various embodiments, the source water pump 130 may include a line that is weighted to weight the line to the bottom of the water body.

Some embodiments of the kiosk for resource distribution 10 may not include the source water pump 130. In such embodiments, the source water reservoir 124 may be manually filled by hand. In other embodiments, the source water reservoir may be filled by siphoning water from a water body 129 to the source water reservoir 124 via a hose (not shown) or other fluid pathway. In some embodiments, the kiosk for resource distribution 10 is arranged such that the source water reservoir 124 may optionally be filled by a source water pump 130 or by an alternative means, such as, but not limited to, those described above.

The source water reservoir 124 may include a liquid level sensor (not shown). The liquid level sensor may be any of a number of different liquid level sensors. In some embodiments, the liquid level sensor may be external to the source water reservoir 124. In various embodiments, the liquid level sensor may be comprised of an armature coupled to a limit switch which is tripped as the water level in the source water reservoir 124 rises to a predefined level. In some embodiments, the limit switch, when tripped, signals to the system to turn off/cut power to the source water pump 130. In other embodiments, the liquid level sensor may be an acoustic sensor, laser range finder, etc. In some embodiments, the liquid level sensor may include a tilt sensor disposed in a float which changes its orientation as water level in the source water reservoir 124 changes.

The source water liquid level sensor may be in communication with the source water pump 130 such that the source water pump 130 will only pump when the source water reservoir 124 is not full. In some embodiments, the liquid level sensor may be in communication with a display 135 which provides a visual signal when the source water reservoir 124 is full. As discussed above, in some embodiments, the liquid level sensor 134 trips a switch which turns off the source water pump 130.

Still referring to FIGS. 1-6, the source water reservoir 124 may additionally include a source-to-still intake conduit 142 which couples the source water reservoir 124 into fluid communication with the intake of the water distillation device 122. The source-to-still intake conduit 142 may be disposed such that it runs under the flooring 17 of the kiosk for resource distribution 10. In an exemplary embodiment, the source-to-still intake conduit 142 may be disposed about an out of the way and exposed path. This minimizes the possibility of the source-to-still intake conduit 142 being damaged and maximizes serviceability of the source-to-still intake conduit 142. Having the source-to-still intake conduit 142 exposed and clearly visible helps to ensure that the source-to-still intake conduit 142 will not be drilled/nailed through during user customization of the housing 12. The source-to-still intake conduit 142 may also include a pressurization or metering pump between the source water reservoir 124 and the water distillation device 122.

Still referring to FIGS. 1-6, in some embodiments, the middle compartment 120 of the kiosk for resource distribution 10 also includes at least one product water reservoir 144. The product water reservoir 144 in the example embodiment stores the distilled, contaminant free, drinkable, product of the water distillation device 122. The product water reservoir 144 may be a rigid structure. The product water reservoir 144 may also be a bulge in the floor, wall, or ceiling of the housing 12 or in the either the first partitioning wall 101 or second partitioning wall 121. In various embodiments, the product water reservoir 144 may be a deformable structure, such as a bladder. In the exemplary embodiment, the product water reservoir 144 is a rigid tank which is capable of storing 250 gallons of clean product water. In various other embodiments, the product water reservoir 144 may be larger or smaller than 250 gallons. In some embodiments there may be one or more product water reservoirs 144.

The product water reservoir 144 may additionally include a still-to-product reservoir conduit 145 which couples the water distillation device 122 into fluid communication with the product water reservoir 144. The still-to-product reservoir conduit 145 allows distilled product water to travel from the water distillation device 122 to the product water reservoir 144. In various embodiments, the still-to-product reservoir conduit 145 may be disposed such that it runs under the flooring 17 of the kiosk for resource distribution 10. In an exemplary embodiment, the still-to-product reservoir conduit 145 is disposed about an out of the way and exposed path. This minimizes the possibility of the still-to-product reservoir conduit 145 being damaged and maximizes serviceability of the still-to-product reservoir conduit 145. Having the still-to-product reservoir conduit 145 exposed and clearly visible may be beneficial for many reasons, including, but not limited to, contributing to ensure that the still-to-product reservoir conduit 145 will not be drilled/nailed through during user customization of the housing 12.

Still referring to FIGS. 1-6, the product water reservoir 144 may be disposed on top of the source water reservoir case 126. Elevating the product water reservoir 144 may be desirable for a number of reasons, including although not limited to, facilitating the dispensing of product water by a gravity feed.

Still referring to FIGS. 1-6, the product water may be dispensed from the product water reservoir 144 via one or more gravity fed product water spigots 146. Some embodiments may feed the water to the one or more product water spigots 146 via a pump which may help in metering of the product water. The product water spigot 146 may be accessible from the exterior of the housing 12 in some embodiments. In other embodiments, the product water spigot 146 may only be accessed from the interior of the kiosk for resource distribution 10. In embodiments where the product water spigot 146 is accessible from the exterior of the housing 12, the product water spigot 146 may be recessed into the housing 12. In other embodiments where the product water spigot 146 is accessible from the exterior of the housing 12 the product water spigot 146 may be removable or otherwise rendered inoperative. This may be advantageous for many reasons, including, but not limited to, one or more of the following: ability to remove the product water spigot 146 during shipping of the kiosk for resource distribution 10, or the ability to remove or disable the product water spigot 146 when the kiosk for resource distribution 10 is "closed for business".

The product water reservoir 144, product water spigot 146 and the conduit connecting the product water reservoir 144 and product water spigot 146 (if any) may be periodically sanitized. This may be done to ensure that the product water remains safe upon delivery. Any suitable known or obvious sanitization method may be used. The quality of the product water being delivered out of the product water spigot 146 may also be periodically tested by any suitable known or obvious method.

The product water reservoir 144 may also include a product liquid level sensor (not shown). The product water liquid level sensor may be any of a number of different product water liquid level sensors. In some embodiments, the product water liquid level sensor may be external to the product water reservoir 144. In various embodiments, the product water liquid level sensor may include an armature coupled to a limit switch which is tripped as the water level in the product water reservoir 144 rises to a predefined level. In other embodiments, the product water liquid level sensor may be an acoustic sensor, laser range finder, etc. In some embodiments, the product water liquid level sensor may include a tilt sensor disposed in a float which changes its orientation as water level in the product water reservoir 144 changes. In some embodiments, the product water liquid level sensor may be a float level sensor.

Some embodiments may include a product water overflow reservoir (not shown). In some embodiments, the product water overflow reservoir may be a separate reservoir which is not attached to the product water reservoir 144. In some embodiments, the source water reservoir 124 may double as the product water overflow reservoir. The product water overflow reservoir may be desirable in the event the product liquid level sensor fails.

In embodiments where the kiosk for resource distribution 10 is being employed as an entrepreneurial business, the entrepreneur(s) or their employees may use the data from the product water liquid level sensor to determine sales. Among other uses, this data may be helpful in determining when and how long to run the water distillation device 122. It may also be helpful in determining how many units of product a customer has purchased and the corresponding amount a customer should be charged. In some embodiments, data from, for example, the product water liquid level sensor may be used from a remote location to aid in the scheduling of maintenance for the water distillation device 122 or other water device.

In some embodiments, the kiosk for resource distribution 10 may include a blowdown conduit (not shown). One end of the blowdown conduit may be coupled to the blowdown outlet on the water distillation device 122. The other end of the blowdown conduit may run back to the water body 129. In other embodiments, the blowdown conduit may be coupled to a blowdown reservoir (not shown). The blowdown conduit may also include a soaker hose type arrangement through which the blowdown is emitted underground. In other embodiments, the blowdown may be handled in any number of other ways which would be apparent to one skilled in the art.

Still to referring to FIGS. 1-6, in some embodiments, the middle compartment 120 of the kiosk for resource distribution 10 may also include at least one refrigerator 160 or other refrigeration apparatus. In an exemplary embodiment, the refrigeration apparatus is a refrigerator 160 with a 15 cubic foot capacity. Other embodiments may include larger or smaller refrigerators 160. The refrigerator 160 may be disposed on top of the source water reservoir case 126. In other embodiments the placement of the refrigerator 160 may vary.

The refrigerator 160 may have a variety of uses. In some embodiments, the refrigerator 160 may be used to store one or more of the following: cooled product water, medical supplies/vaccines, food, commercial beverages, other commodities, etc. In an exemplary embodiment, the refrigerator 160 is thermally coupled to a 20 gallon, auxiliary product water reservoir 162. In other embodiments the size of the auxiliary product water reservoir 162 may vary. The auxiliary product water reservoir 162 may be plumbed into the product water reservoir 144.

In some embodiments, the refrigerator 160 may be coupled to a cooled product water spigot (not shown) for dispensing cooled product water. In some embodiments, the cooled product water spigot is gravity fed and the auxiliary product water reservoir 162 is elevated in relation to the cooled product water spigot thus facilitating the gravity feed. The cooled product water spigot may be accessible from the exterior of the housing 12 in some embodiments. In other embodiments, the cooled product water spigot may only be accessed from the interior of the kiosk for resource distribution 10. In embodiments where the cooled product water spigot is accessible from the exterior of the housing 12, the cooled product water spigot may be recessed into the housing 12. In other embodiments where the cooled product water spigot is accessible from the exterior of the housing 12 the cooled product water spigot may be removable or otherwise rendered inoperative. This may be advantageous for a variety of reasons, including, but not limited to one or more of the following: ability to remove the cooled product water spigot during shipping of the kiosk for resource distribution 10, or the ability to remove or disable the cooled product water spigot when the kiosk for resource distribution 10 is "closed for business".

Still referring to FIGS. 1-6, in an exemplary embodiment, the refrigerator 160 has a medical refrigeration section 168 (for example, shown in FIG. 22) for storing medical supplies/vaccines. The medical refrigeration section 168 may have its own separate compartment within the refrigerator 160 or may be a shelf within the interior of the main refrigerator 160. In some embodiments, the medical refrigeration section 168 may include its own separate refrigerator 160. In some embodiments the medical refrigeration section 168 may be completely segregated and isolated from the rest of the refrigerator 160. For example, in some embodiments, the medical refrigeration section 168 may be segregated from the rest of the refrigerator 160 such that the medical refrigeration section 168 may be the only section of the refrigerator 160 accessible from one side of either the first partitioning wall 101 or second partitioning wall 121. The rest of the refrigerator 160 may only be accessed from the other side of the first partitioning wall 101 or second partitioning wall 121. This may help to prevent any cross contamination.

The medical refrigeration section 168 of the refrigerator 160 may be beneficial for many reasons, including, but not limited to, the ability to render aid in emergency relief and military applications, storage of vaccines, etc. Additionally, in entrepreneurial applications of the kiosk for resource distribution 10, refrigerated medical supplies may contribute to making the kiosk for resource distribution 10 a community center. By making the kiosk for resource distribution 10 into a community center, the entrepreneurial micro-business is afforded more exposure to potential customers.

As discussed above, in various embodiments, the refrigerator 160 may also be used to refrigerate food or other commercial beverages, such as, but not limited to, soda, juice, sports drinks, bottled water etc. Such a capability may be attractive for a variety of reasons including, but not limited to, one or more of the following: expanding relief potential in emergency/disaster situations, increasing utility in military applications, and increasing the number of products offered by an entrepreneurial micro-business.

Still referring to FIGS. 1-6, the middle compartment 120 of the kiosk for resource distribution 10 may include a number of other components. In some embodiments, the middle compartment 120 may also include at least one oven 190. The oven 190 is discussed in more detail below. Additionally, in some embodiments, the interior walls defining the middle compartment 120 may include shelving/displays 198 (see FIG. 18) such as baskets or the like for various commodities or supplies. The doors 16 may also include shelving/displays 198. As discussed above, the interior walls of the housing 12 may be covered with a wall material 15, for example, plywood. This allows the user of the kiosk for resource distribution 10 to modify the amount, location, etc. of shelving/displays 198 as desired or needed.

Some embodiments may include one or more doors 16 that are expandable. For example, the doors 16 may include fold out panels hingedly coupled to the door 16. In other embodiments, one or more doors 16 may include a slide out portion. This may be desirable because it creates more surface area to which shelving/displays 198 may be coupled.

Still referring to FIGS. 1-6, a third section of the housing 12, may be the power compartment 200 of the kiosk for resource distribution 10. In the embodiments shown, the power compartment 200 is defined by the right end barn type doors 16a of the housing 12 and the second partitioning wall 121.

In some embodiments, the power compartment 200 may include at least one fuel requiring element 102. In some embodiments, the term "power generating device" may be used interchangeably with fuel requiring element 102. In some embodiments, the device may be a power generating device and in some embodiments, the power generating device may also be a fuel requiring element 102. In an exemplary embodiment the fuel requiring element 102 is a Stirling engine which is capable of generating 10 kW of power. In other embodiments, the fuel requiring element 102 may differ or there may be multiple fuel requiring elements 102 and/or power generating devices. For example, other generators or other varieties of Stirling generators may be used. Examples of some embodiments of Stirling engines that may be included are described in U.S. patent application Ser. No. 13/447,990, filed Apr. 16, 2012 and entitled Stirling Cycle Machine, which is hereby incorporated herein by reference in its entirety. As described above, the fuel requiring element 102 is in communication with one or more of the one or more fuel storage tanks 104 via a connector (not shown). The connector provides the fuel to the fuel requiring element 102. In some embodiments, the kiosk for resource distribution 10 may, for example, be grid tied a land power source (not shown) which may be considered the power generating device. In some embodiments, access to a land power source may be supplemental to the fuel requiring element 102 or may replace the fuel requiring element 102. In some embodiments, the power generating device or at least one of the power generating devices may be solar powered, wind powered, etc. The fuel requiring element 102 may provide power to the kiosk for resource distribution 10 which may allow the kiosk 10 to provide any number of functions, services, etc.

In some embodiments, there may be at least one exhaust vent (not shown) which vents the exhaust from the fuel requiring element 102. In other embodiments, the fuel requiring element 102 may be moved external to the housing 102 when in use so that exhaust venting is not an issue. When the fuel requiring element 102 is not in use, it may be moved back into the housing 12 where it may be locked away when the kiosk for resource distribution 10 is "closed for business". This prevents an individual from stealing or tampering with the fuel requiring element 102.

In some embodiments, the waste heat of the fuel requiring element 102 may utilized as a resource for another application or process. This may improve the capabilities, functionality, and efficiency of the kiosk for resource distribution 10. One application for the waste heat may be preventing the source water from freezing or the pre-heating of source water as it sits in the source water reservoir 124. In another possible application, the waste heat may be directed to at least one oven 190 or similar heating element. The oven 190 may be used for a wide variety of applications. In some embodiments, the oven 190 may be used in one or more of a medical, culinary, or pottery application. The oven 190 may also be employed for other applications. In some embodiments, the oven 190 may include three shells: an outside shell, a middle shell and an inner shell. The inner shell may be the oven 190 and may include a variety of fixtures and of be dimensioned so as to be configured for the intended use. In some embodiments, the outer shell may be an insulator shell and the middle shell may include a space where the exhaust input releases the exhaust and where the exhaust exits the space. Thus, the exhaust provides indirect heat to the oven 190 or inner shell, but does not allow direct exposure of the inner shell/oven 190 to the exhaust. In various embodiments, the one or more compartments of the housing 12 may include one or more carbon monoxide sensors.

In some embodiments, the oven 190 may be encased by an air tight compartment surrounding the exterior of the oven 190. The oven temperature may be controlled by a lever or baffle (not shown) which has the ability to regulate the amount of exhaust gas flowing to the air tight compartment surrounding the exterior of the oven 190. In some embodiments, the lever or baffle is a bi-metallic lever. In some embodiments, the oven temperature may be computer controlled with an electronic temperature sensor. The oven 190 may also include one or more access doors 193 which allow a user to access the cooking cavity within the oven 190. In various embodiments, the oven 190 has at least one access door 193 which can be opened from the interior of the housing 12 and at least one access door 193 which may be opened from the exterior of the housing 12. In some embodiments, specifically embodiments where the kiosk for resource distribution 10 is being used in an entrepreneurial application, the oven 190 may include a coin, token, or otherwise monetarily operated mechanism (not shown). The monetarily operated mechanism 195 allows an entrepreneur to use the oven 190 as a revenue source. In other embodiments, the oven 190 may be converted to an autoclave for medical purposes. In some embodiments, the oven 190 may also include a thermometer 196 (not shown).

Figure 2:
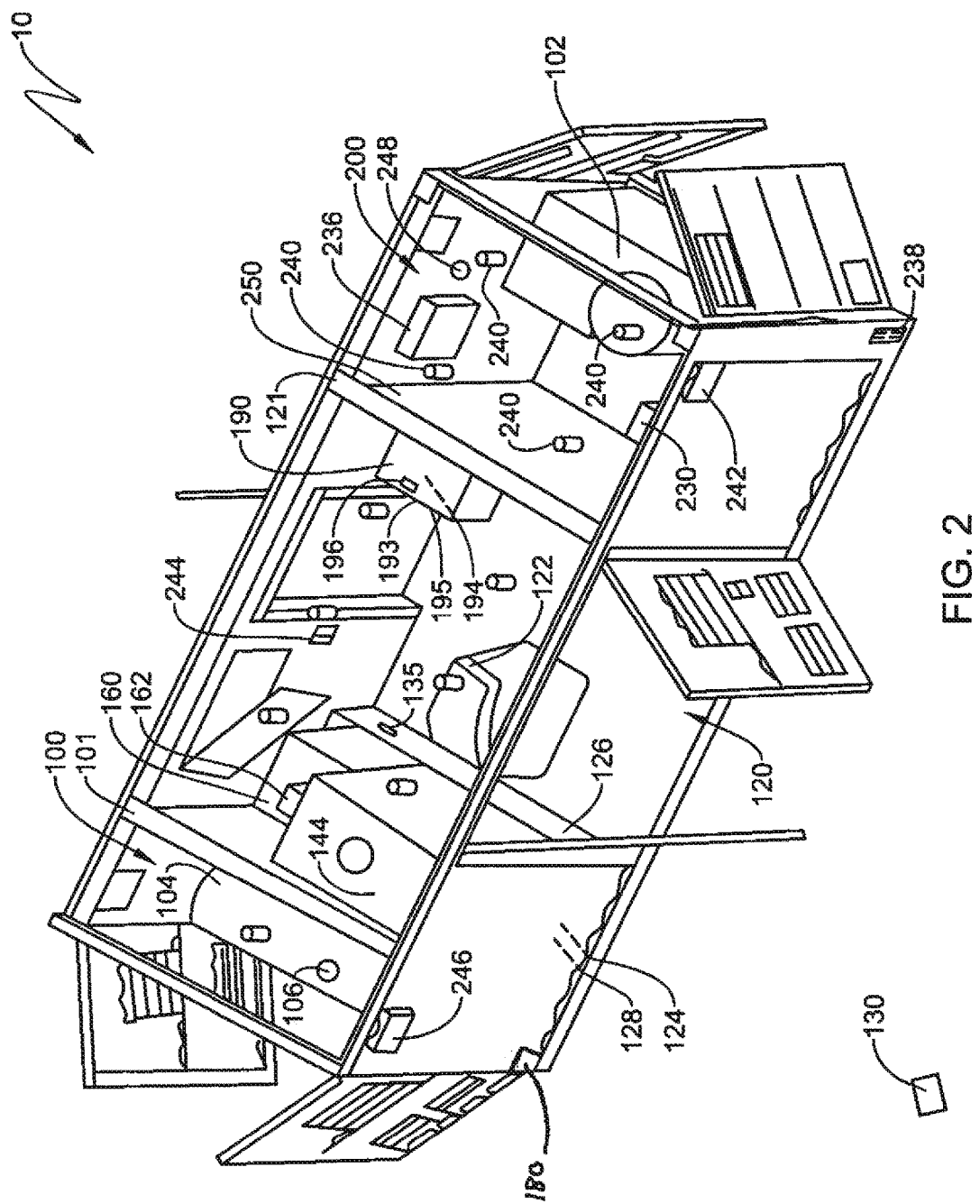
FIG. 2 is a view of an example of a kiosk for resource distribution in accordance with an embodiment of the present disclosure.

In some embodiments, for example, in the embodiment shown in FIG. 2, two ovens 190 may be included. One of the ovens 190 may be accessible only from exterior of the housing 12 and the second oven 190 may be accessible from only the interior of the housing 12. Arranged as such, an oven 190 may be accessible at all times, i.e., the exterior oven 190 may be accessible at all times and the interior oven 190 may only be accessible when the middle compartment 120 is "open for business". Additionally, the arrangement may also be beneficial for it obviates the possibility of an individual easily gaining access to the interior of the housing 12 via the oven 190 during hours where the kiosk for resource distribution 10 is "closed for business". In an example embodiment in FIG. 2, the two ovens 190 are created by a partition of the cooking cavity into to segregated sections. An access door 193 to one half of the partitioned cooking cavity may be opened from the exterior of the housing 12. The other half of the partitioned cooking cavity may be accessed via an access door 193 which is only accessible from the interior of the housing 12.

Referring still to FIGS. 1-6, the waste heat of the fuel requiring element 102 may also be utilized to a number of other ends. For example, the waste heat may be used to run a smoker, grill, hot plate, or for any other baking or culinary application. In some embodiments, the waste heat may be used to perform various value added processes. The waste heat may be used to roast coffee or dry tea, for example, which would allow the kiosk for resource distribution 10 to make more money with the raw materials available to it. Additionally, the kiosk for resource distribution 10 would be able to function as a café. The waste heat may also be used to dry food or powder food (e.g. milk) so that it lasts longer and is easier to transport for trade purposes. In some embodiments, the waste heat may be used in hot process saponification to aid in the production of soap. The waste heat may be used to pasteurize various foods. In some embodiments, the waste heat may also be used in the production of cheese.

The waste heat may be used for sanitizations processes as well. For example, the waste heat may be used to create steam to clean containers such as the product water containers 940 described below with respect to FIG. 11. The waste heat may also be used to evaporate the blowdown from a water distillation device 122. In some embodiments, the waste heat may be used to evaporate human urine for the production of fertilizer. In some embodiments, the waste heat may be used by one or more biodigesters or gasification units.

Still referring to FIGS. 1-6. in some embodiments, the power compartment 200 may additionally include a radiator 224 (not shown). In various embodiments, the radiator 224 may be removably coupled to the roof of the housing 12 such that the radiator 224 may be removed and placed inside the housing 12. This may be desirable in many situations, including, but not limited to, shipping, inclement weather, or when the kiosk for resource distribution 10 is "closed for business". The radiator 224 may be coupled into communication with the fuel requiring element 102 by a coolant conduit 226 so that the radiator 224 may cool the fuel requiring element 102.

The power compartment 200 may also include a battery bank 230 or other power storage device such as but not limited to a flywheel, compressed gas energy storage device, thermal energy storage device, etc. The battery bank 230 may be useful for a variety of reasons and applications, including but not limited to, start up of the fuel requiring element 102, load balancing for allowing peak power loads higher than that which the fuel requiring element 102 can satiate on its own, etc. The battery bank 230 may be charged by the fuel requiring element 102 or other power generating device such as a solar panel or wind turbine. In an exemplary embodiment, the battery bank 230 may be a bank of sealed, lead acid, deep draw batteries. Other embodiments may include different battery bank 230 arrangements, for example, the battery bank 230 may be a bank of lithium ion or traction batteries. In the exemplary embodiment, the battery bank 230 may be located inside the housing 12 such that it is protected and secure.

In various embodiments, the power compartment 200 may also include an electrical distribution box 236. The electrical distribution box 236 may distribute the power generated by the fuel requiring element 102 or other power generating device. In some embodiments, wiring to and from the electrical distribution box 236 may follow an exposed, out of the way path. Such an arrangement may be desirable for many reasons, including, but not limited to, because it helps to ensure that a user does not drill, nail, cut, etc. into the wiring during customization of the housing 12. Additionally, such a configuration may increase serviceability.

In some embodiments, the electrical distribution box 236 distributes power to at least one outlet 238 and/or at least one light 240. Various embodiments may include outlets 238 and/or lights 240 on both the interior and the exterior of the housing 12. In some embodiments, outlets 238 and/or lights 240 may be disposed only on either the exterior or interior of the housing 12. The electrical distribution box 236 may also distribute power to any number of other power requiring elements which may be included the kiosk for resource distribution 10.

Referring still to FIGS. 1-6, in some embodiments, the exterior of the housing 12 has two, 120V AC outlets 238 on each corner of the housing 12. In some embodiments, the interior of the housing 12 has eight, 120V AC outlets 238 and one 208V AC outlet 238. Additionally, in some embodiments the interior of the housing 12 includes 11 LED lights 240 each being a 60 watt incandescent equivalent. However, in various embodiments, the location and the number of outlets may vary. Some embodiments may not include outlets. In some embodiments, the housing 12 may also include four LED flood lights 240 with 120 watt incandescent equivalence coupled to the top corners of the housing 12 to illuminate the area around the kiosk for resource distribution 10. The four LED flood lights 240 may be useful to provide security, a study space, a community space, or to extend the business hours of an entrepreneur. LED lights 240 may be desirable/beneficial for a number of reasons. For example, LED lights 240 are efficient and their long life minimizes the amount of consumables necessary to maintain the kiosk for resource distribution 10. In other embodiments, the quantity, voltages, locations, etc. of the outlets 238 may vary. Similarly, in other embodiments, the quantity, wattage, locations, etc. of the lights 240 may vary. Some alternate embodiments may use incandescent, fluorescent, compact fluorescent, neon, or other varieties of lights 240.

In some embodiments, the interior lights 240 may be spread across a number of different segments of the housing 12. In some embodiments the lights 240 may be arranged, such that the middle compartment 120 is subjected to approximately 50 candles per square foot, the equivalent to standard office lighting. In some embodiments, the power compartment 200 may be illuminated to a comparatively higher number of candles per square foot. In some embodiments, there may only be one light 240 in the storage area 100.

In some embodiments, the exterior lights 240 may be coupled to the inside of the housing 12. In such embodiments, the lights 240 may be placed behind one or more windows 242 through which they may illuminate an area. In some embodiments, the window(s) 242 may be impact resistant ½" thick, transparent polycarbonate or any other suitable material with any suitable thickness. However, in various other embodiments, the thickness and the material of the one or more windows may vary. In various embodiments, it may be desirable to dispose the exterior lights 240 on the interior of the housing 12 behind a window 242 to prevent damage, theft, etc. of the lights 240.

In some embodiments, the lights 240 may be controlled by manual switches 244. The manual switches 244 may be located on at least one of the interior or exterior of the housing 12. Depending on the embodiment, each individual light 240 may be controlled by its own manual switch 244, or more than one light 240 may be controlled by the same manual switch 244. In some embodiments, at least one of the lights 240 may include a sensor 246 which turns at least one light 240 on or off. In an exemplary embodiment, the exterior lights 240 may include a dawn/dusk sensor 246 which shuts off the lights 240 during daylight hours. In other embodiments at least one of the lights 240 may include other types of sensors 246, such as a motion sensor etc. In embodiments where at least one of the lights 240 includes a sensor 246, the sensor 246 may be manually overridden by one or more manual switch 244. In some embodiments, the at least one manual switch 244 may control other components of the kiosk for resource distribution 10.

In some embodiments, the housing 12 may include at least one ambient air monitor 248. The ambient air monitor 248 may, for example, be a carbon monoxide ("CO") detector. In other embodiments, the housing 12 may also include a smoke detector, etc. in place of or in addition to a CO detector. Such ambient air monitors 248 may help to increase safety of the kiosk for resource distribution 10.

Some embodiments of the kiosk for resource distribution 10 may include a safety hatch 250 (not shown) disposed on the housing 12. The safety hatch 250 may be desirable in a variety of situations, including, but not limited to the following: a user accidentally locking themselves in the housing 12, a fire, etc.

Figure 3:
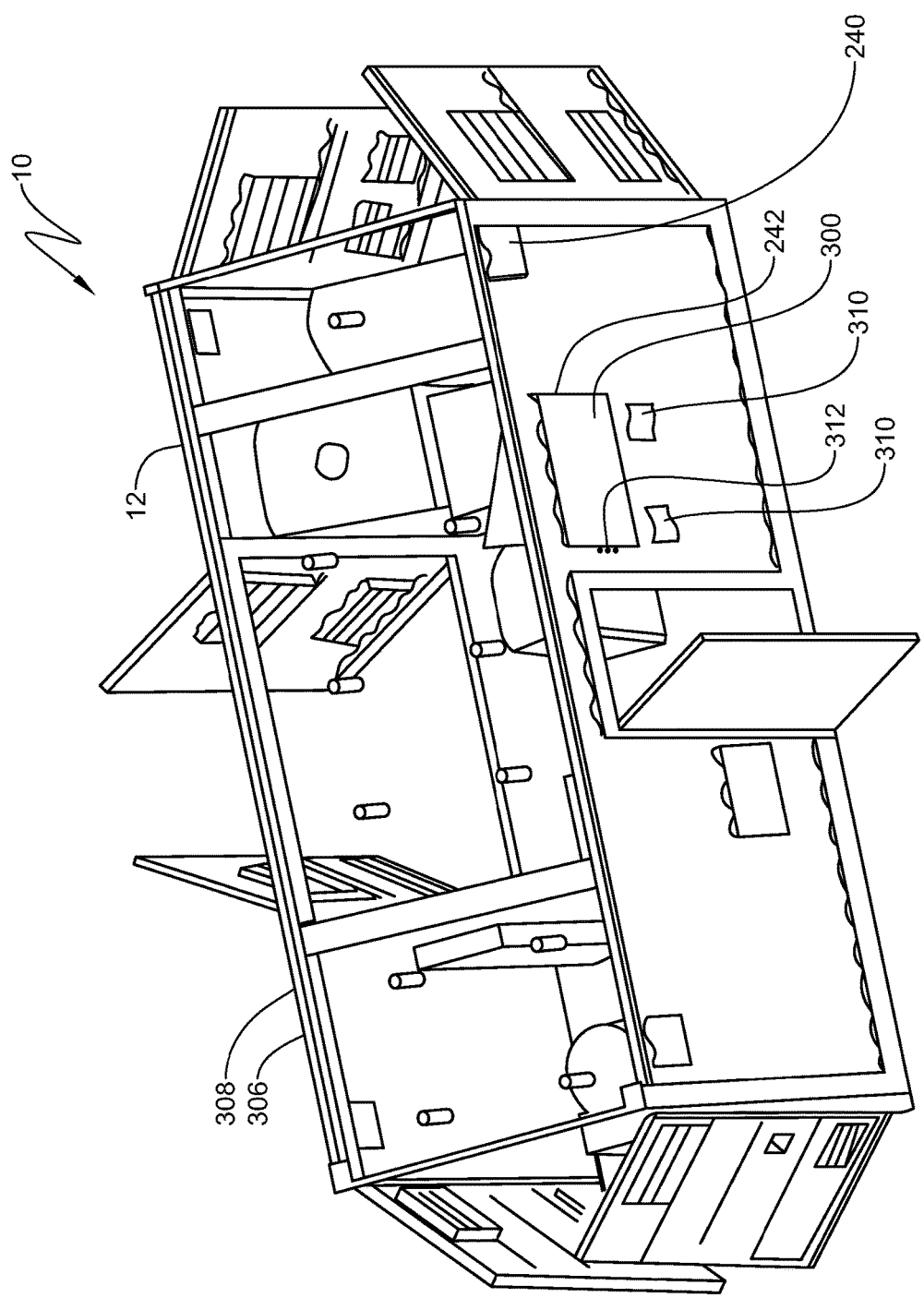
FIG. 3 is a view of an example of a kiosk for resource distribution in accordance with an embodiment of the present disclosure.

Still referring to FIGS. 1-6, in some embodiments, the kiosk for resource distribution 10 may include a TV 300. The TV 300 may be viewable from the exterior of the housing 12. In an exemplary embodiment, the TV 300 is of the flat screen variety which may be desirable/beneficial because a flat screen TV 300 requires less space than other TV 300 varieties. In various embodiments, the TV 300 need not be a flat screen TV 300. As shown in FIG. 3, the TV 300 may be disposed on the interior of the housing 12 such that the screen of the TV 300 is viewable through a window 242. This prevents the TV 300 from being stolen, damaged, etc. Some embodiments may include any number of other windows 242 in addition to the windows 242 for the TV 300 and flood lights 240. In an exemplary embodiment the window (s) 242 are made from highly impact resistant, ½" transparent polycarbonate plastic as mentioned above. In various embodiments, the thickness and type of material may vary. In various embodiments, the TV 300 is in communication with a recorded media player 304 (not shown). This enables the kiosk for resource distribution 10 to screen movies, etc. on the TV 300. In some embodiments, the TV 300 may be coupled to at least one of a satellite dish 306 or antenna 308 (see FIG. 5) for its signal. In some embodiments, a projector for projecting the output of the TV 300 may be included in the kiosk for resource distribution 10.

In some embodiments, the TV 300 may be shaded by at least one of the one or more awnings 19 described above. This may be desirable for many reasons, including, but not limited to, its ability to allows the TV 300 to be seen much more easily in highly sunny conditions.

Still referring to FIGS. 1-6, additionally, in some embodiments, the kiosk for resource distribution 10 may also include one or more speakers 310 which may serve as an audio output of the TV 300. In an exemplary embodiment, the one or more speakers 310 are all-weather speakers which are resistant to water, sand, debris, etc. However, in various other embodiments, the speakers 310 may vary. Additionally, in an exemplary embodiment, the one or more speakers 310 are fixedly coupled to the housing 12 from the interior of the housing 12. This may be desirable/beneficial for many reasons including, but not limited to, contribution to prevent damage, theft, etc. of the one or more speakers 310. In some embodiments, the speakers 310 may also be configured such that they may serve as the audio output for a radio (not shown).

In some embodiments, the TV 300 may be controlled manually via an interface panel 312 which is easily accessible. Through the interface panel 312, a user may, for example, be able to adjust the volume, channel, etc. of the TV 300. In other embodiments control of the TV 300 may be accomplished by means of a remote control (not shown) for the TV 300. In some embodiments, the TV 300 may be controlled via both an interface panel 312 and a remote control.

In various embodiments, the TV 300 may be used in a variety of ways, some of which are described below. These examples, however, are merely illustrative and not limiting. For example, in an emergency situation, the TV 300 may be used to provide victims news or other important information. The TV 300 may, moreover, be used as a video link with doctors located offsite. This may be useful for training of medical staff, offsite diagnosis, other tele-medicine applications, etc. In a military application, the TV 300 may be used to provide a video link with other service members, commanders, military hardware, etc. The TV 300 may also be useful in a "hearts and minds" campaign. In embodiments where the kiosk for resource distribution 10 is an entrepreneurial venture, the TV 300 may help make the kiosk for resource distribution 10 a community center. As a microbusiness and community center, the kiosk for resource distribution 10 has more exposure to potential customers. Additionally, an entrepreneur may use the TV 300, recorded media player, and/or projector to make the kiosk for resource distribution 10 function as a theater for which they may charge admission. In some embodiments, at least one of the TV 300, recorded media player, and projector may also be used for educational purposes. In various embodiments, the kiosk for resource distribution 10 may include additional educational components.

Figure 4:
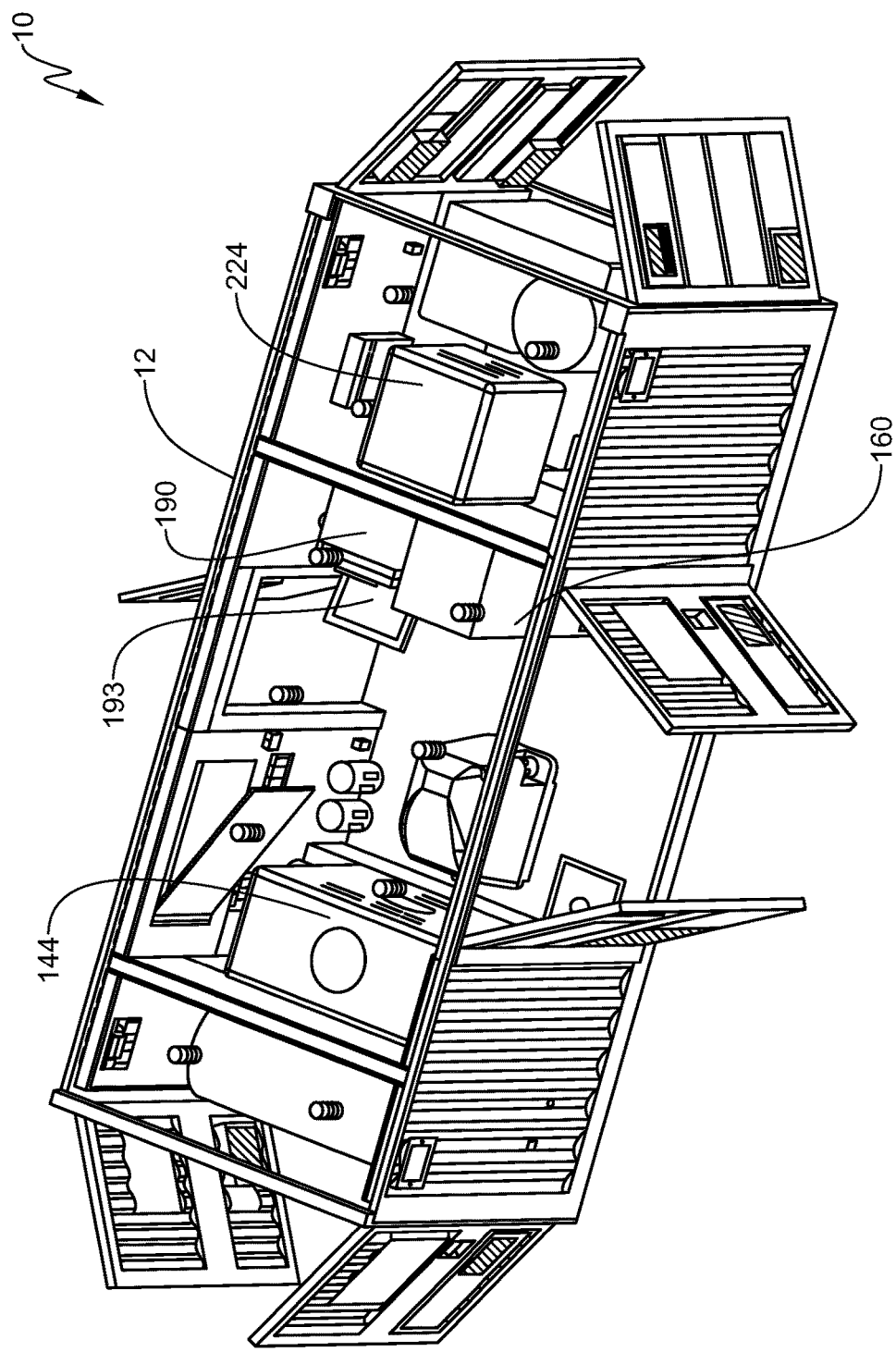
FIG. 4 is a view of another example of a kiosk for resource distribution in accordance with an embodiment of the present disclosure.

Still referring to FIGS. 1-6, in some embodiments, for example FIG. 4, the housing 12 for the kiosk for resource distribution 10 is a storage container. The kiosk for resource distribution 10 in FIG. 4 is arranged similarly to the embodiment depicted in FIGS. 1-3. As shown, the kiosk for resource distribution shown in FIG. 4 only includes a single oven 190. The oven 190 has two access doors 193. One of the access doors 193 of the oven 190 allows access to the oven 190 from the exterior of the container. The other access door 193 of the oven 190 allows access to the oven from the interior of the container. The refrigerator 160 is not located next to the product water reservoir 144 as it is in FIGS. 1-3. In some embodiments, the product water reservoir 144 opposite the refrigerator 160, as for example, shown in FIG. 2. As in the embodiment shown in FIG. 4, some embodiments may not include the auxiliary product water reservoir 162 or cooled product water spigot. A radiator 224 is also shown in FIG. 4. The radiator 224 is disposed on the roof (not shown) of the housing 12. As mentioned above, the radiator 224 may be removably coupled to the housing 12 so that it may be removed and stored inside the housing 12 when the kiosk for resource distribution 10 is "closed for business", during inclement weather, etc.

Figure 5:
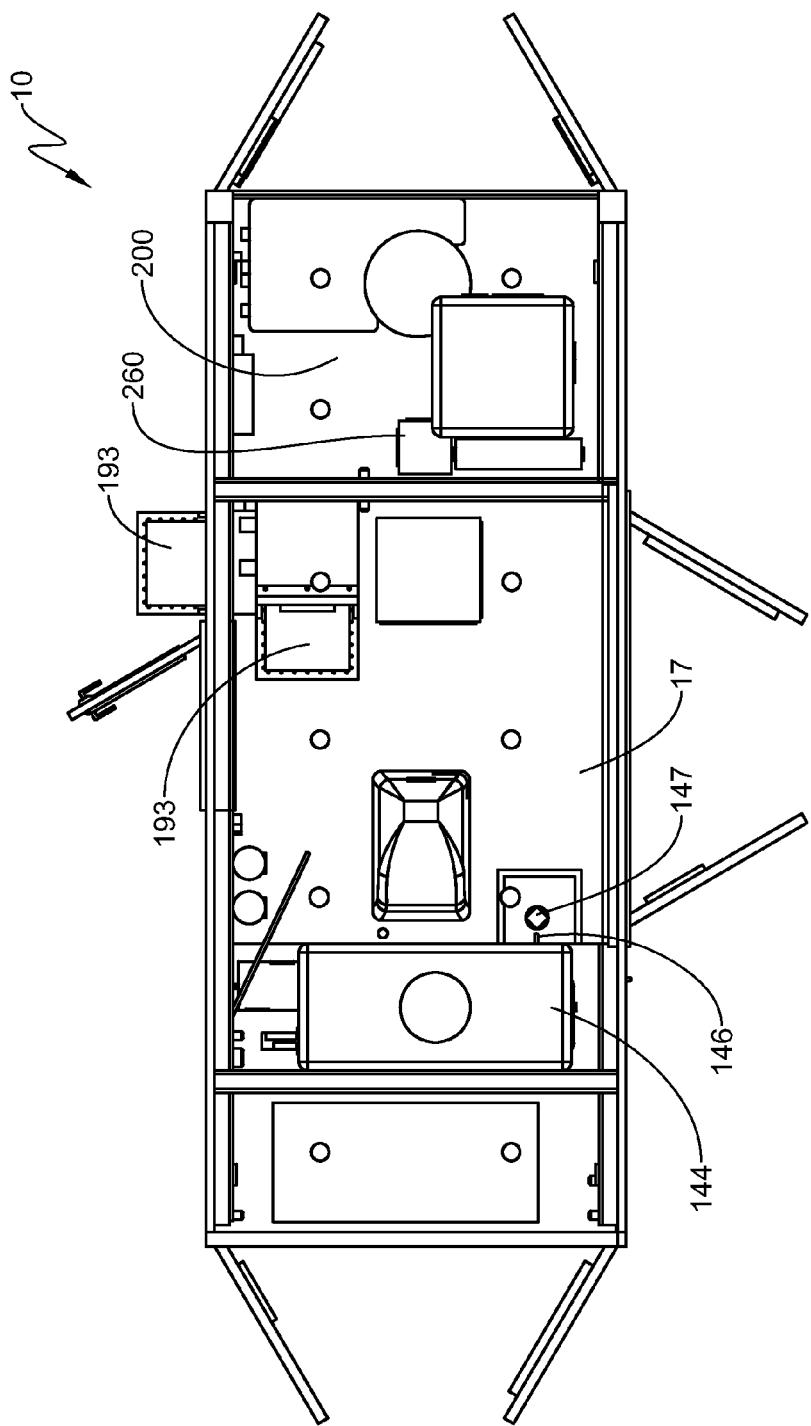
FIG. 5 is a view of another example of a kiosk for resource distribution in accordance with an embodiment of the present disclosure.

Still referring to FIGS. 1-6, some embodiments of the kiosk for resource distribution 10 include a product water spigot 146 for the product water tank 144 is only accessible from the interior of the container. As shown, a drain 147 may be placed under the product water spigot 146 so that any spilling or overflow does not pool inside the kiosk for resource distribution 10. In some embodiments, the drain 147 may be cut into the flooring 17 of the kiosk for resource distribution 10. In some embodiments, the drain 147 may be at the lowest point of a basin which is recessed into the floor or flooring 17 of the kiosk for resource distribution 10. Some embodiments may include multiple drains 147. For example, in embodiments where an auxiliary product water reservoir 162 and cooled product water spigot are included, a drain 147 may be disposed under the cooled product water spigot. As is also shown in FIG. 5 the kiosk for resource distribution 10 may also include an ACDC converter 260. In the example embodiment shown, the ACDC converter 260 is disposed inside the power compartment 200.

Figure 6:
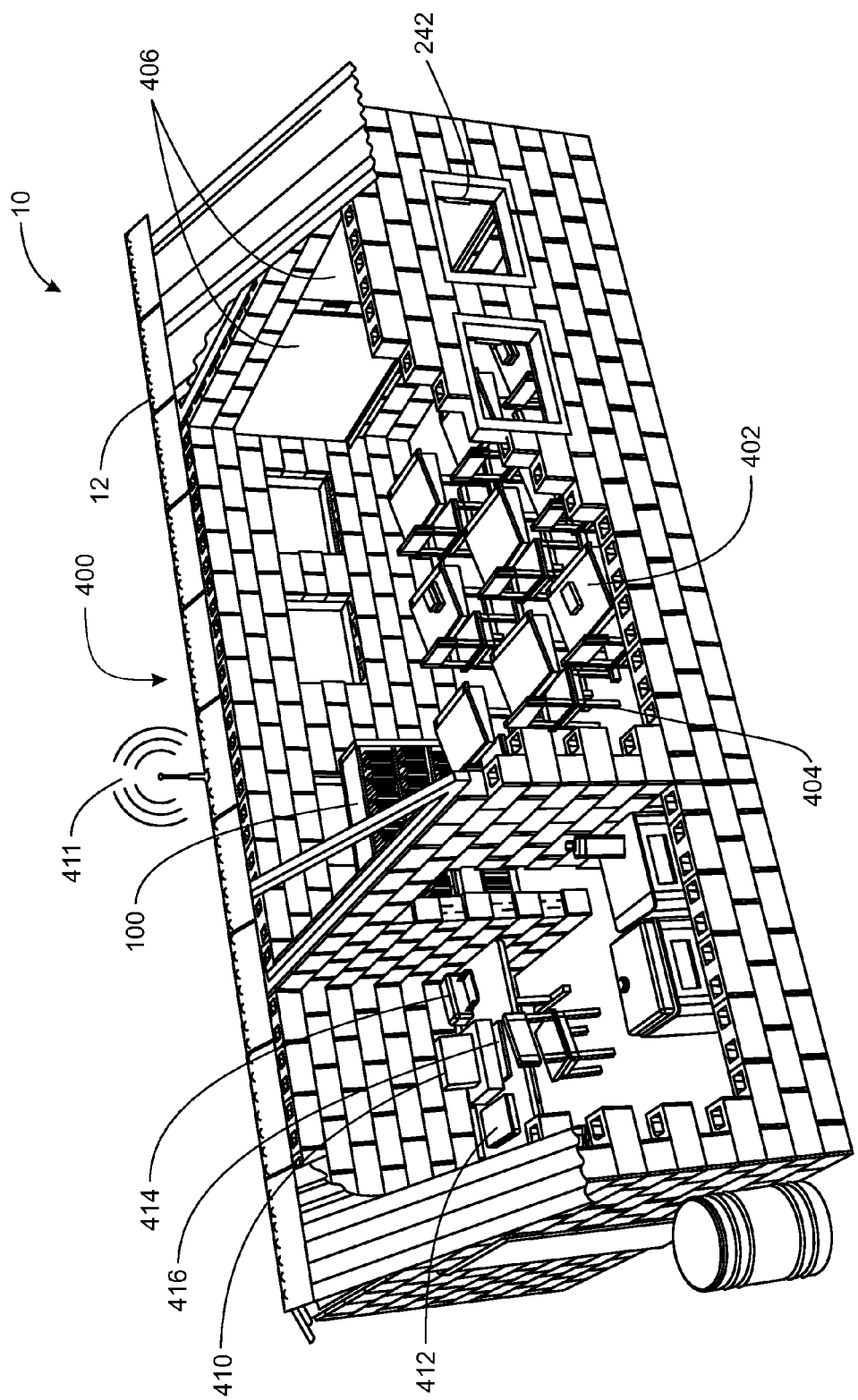
FIG. 6 is a view of another example of a kiosk for resource distribution in accordance with an embodiment of the present disclosure.

Referring to FIG. 6, an embodiment of the kiosk for resource distribution 10 is shown where the housing 12 is a building. At least one part of the housing 12 building is a classroom 400. Though the classroom 400 in FIG. 6 is on the interior of the housing 12, other embodiments with a classroom 400 may locate the classroom 400 elsewhere. In some embodiments, for example, the classroom 400 may be exterior to the housing 12 and/or under an awning 19. Some embodiments may include other educational spaces in addition to or instead of the classroom 400. For example, a lighted area for studying may be included in the kiosk for resource distribution 10 or around the kiosk for resource distribution 10.

In the non-limiting embodiment depicted in FIG. 6, the classroom 400 may, in some embodiments, include a number of desks 402 and chairs 404. A storage area 100 for books and other learning materials may also be among the elements comprising the kiosk for resource distribution 10. Additionally, as shown in FIG. 6, embodiments including a classroom 400 may further include one or more educational board (s) 406. The educational board (s) 406 may be any of a variety of different educational boards 406 including, but not limited to, chalkboards, whiteboards, blackboards, dry erase boards, smartboards, bulletin boards, cork boards, etc.

In some embodiments, the kiosk for resource distribution 10 may include at least one computer 410. In some embodiments, at least one of the at least one computers 410 may be included as an element of the classroom 400 as shown in FIG. 6. In other embodiments, and referring also to FIG. 7, the at least one computer 410 may not be a part of a classroom 400 as shown in FIG. 6. The at least one computer 410 may be loaded with educational software. In some embodiments, the at least one computer 410 may have an internet connection 411. In various embodiments, the at least one computer 410 may also be in communication with various accessories. In the embodiment depicted in FIG. 6, at least one computer 410 is in communication with a scanner 412, printer 414, and a keyboard 416. Alternate embodiments may include any number of other accessories or combination of accessories such as speakers, computer connected weather instruments, etc.

The at least one computer 410 may be used for any number of purposes, such as, but not limited to those described in the following paragraphs. The at least one computer 410 may be used as an online classroom. For example, a student may use the at least one computer 410 to remotely take classes. The at least one computer 410 may also be used to download learning materials, e-books, media, etc. The at least one computer 410 may be used to access news or weather data. In some embodiments, such as the embodiment shown in FIG. 7, the at least one computer 410 may included as part of a cyber café. The local population may use the at least one computer 410 to e-mail or surf the web. In some embodiments, the at least one computer 410 may be used in conjunction with a printer 414 for printed media distribution.

In some embodiments, the at least one computer 410 may be used for online shopping. Items not available directly in the kiosk for resource distribution 10 may be purchased over the internet via the at least one computer 410. The kiosk for resource distribution 10 may be used as a post office or shipping destination where such items may be delivered and picked up. In such embodiments, other mail may also be delivered to the kiosk for resource distribution 10. The at least one computer 410 may also be used to open up local products and crafts to the global market. The at least one computer 410 may also enable an entrepreneur to purchase various parts to run a repair shop. In some embodiments, the at least one computer 410 may be used to solicit micro-loans online or conduct other financial affairs such as banking.

Figure 7:
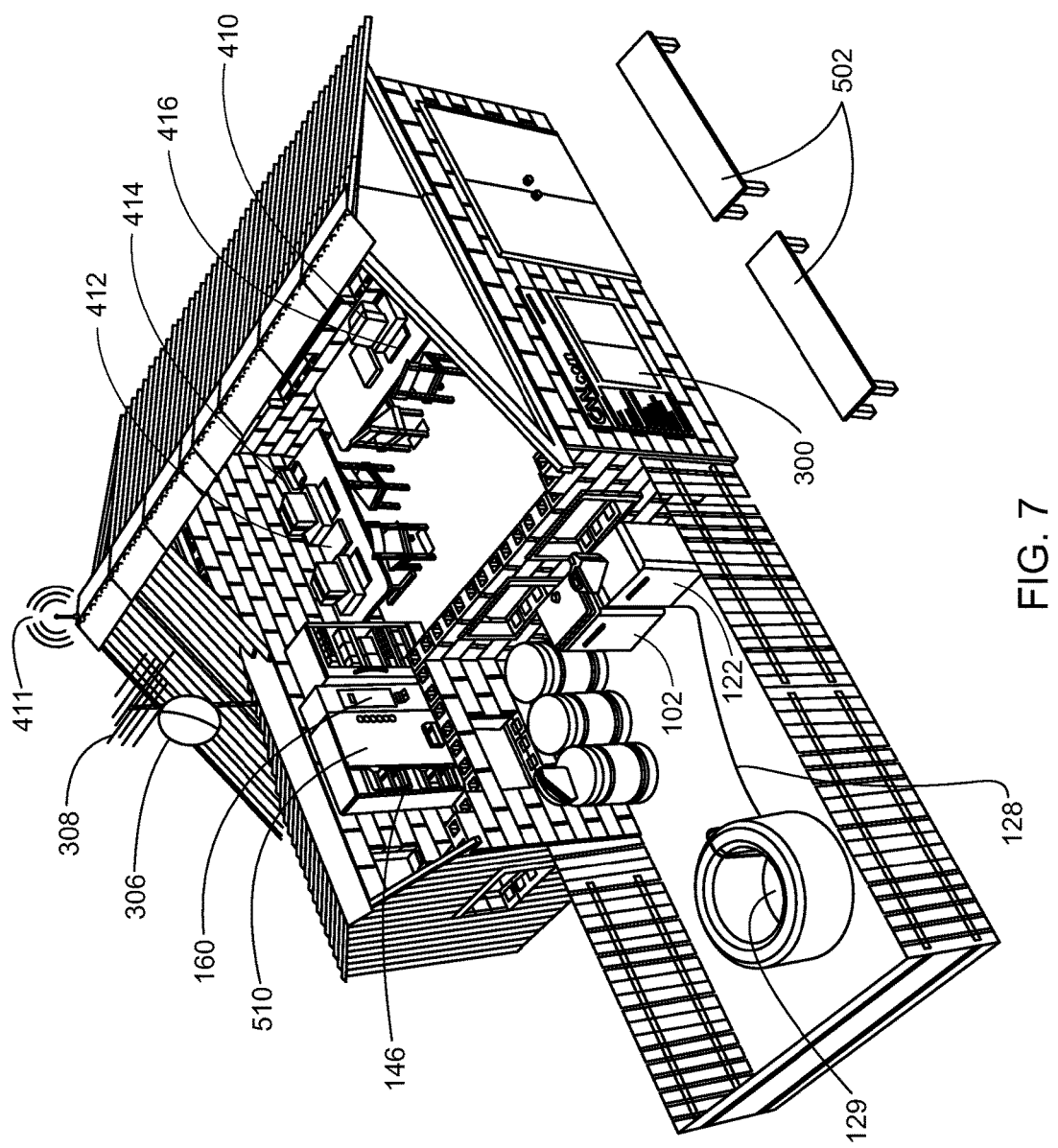
FIG. 7 is a view of another example of a kiosk for resource distribution in accordance with an embodiment of the present disclosure.

Referring now also to FIG. 7, in some embodiments, the kiosk for resource distribution 10 may be surrounded by at least one seat, and in some embodiments, seating 502. The seating 502 may encourage the kiosk for resource distribution 10 to be used as a community center where people come to meet and socialize. This helps to ensure a flow of potential customers around the kiosk for resource distribution 10. In some embodiments, the seating 502 may be included in embodiments where the kiosk for resource distribution 10 operates a café, bakery, restaurant, etc. to provide a place to sit while eating.

In various embodiments, such as the one illustrated in FIG. 7, at least one refrigerator 160 may be included as part of a larger vending machine unit 510. The vending machine unit 510 may include a monetarily operated mechanism which controls the dispensing of products from the vending machine 510. In some embodiments, the vending machine 510 may also include the product water spigot 146 and the cooled product water spigot.

Figure 8:
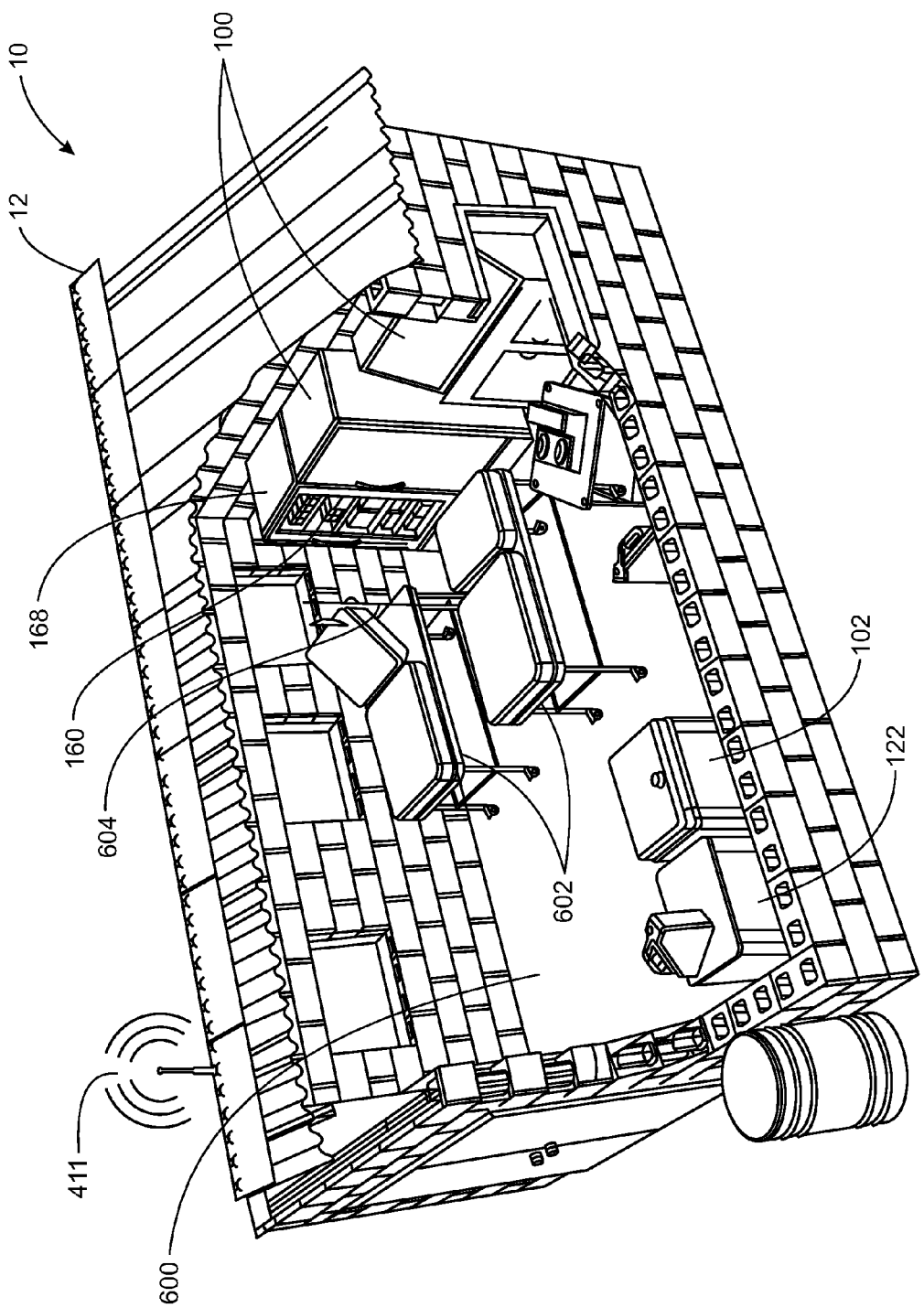
FIG. 8 is a view of another example of a kiosk for resource distribution in accordance with an embodiment of the present disclosure.

Referring now also to FIG. 8, an embodiment of the kiosk for resource distribution 10 where the housing 12 is a building is depicted. As shown in FIG. 8, the kiosk for resource distribution 10 may include a medical clinic 600. In embodiments including a medical clinic 600, the medical clinic 600 may include various medical equipment. In some embodiments, the various medical equipment may include beds 602 for patients of the medical clinic 600. In some embodiments, the various medical equipment may also include one or more medical poles 604 such as, but not limited to IV poles. As shown in FIG. 8, the kiosk for resource distribution 10 may also include one or more refrigerators 160. In the embodiment shown, the medical refrigeration section 168 of the refrigerator 160 includes its own refrigerator 160. Additionally, the medical clinic 600 may have a storage area 100 for storing non-temperature sensitive medical supplies such as, but not limited to, bandages, nutrition packages, vitamins, sexual health supplies, anti-malarial medicine, medical instruments etc. In some embodiments, the medical clinic 600 may include, for example, at least one water distillation device 122 and at least one fuel requiring element 102 to ensure a reliable power supply. The medical clinic, in some embodiments, may also include an internet connection 411. In some embodiments, one or more storage area may additionally be included in various embodiments of the medical clinic 600.

In some embodiments, the medical clinic 600 may be a veterinary clinic for live stock, pets, etc. In some embodiments where the kiosk for resource distribution 10 is an entrepreneurial business, disaster relief installation, or includes a medical clinic 600 the kiosk for resource distribution 10 may function as a medical supply center. In such embodiments, people may come to the kiosk for resource distribution to purchase or be given medical supplies such as bandages, anti-septic, vitamins, sexual health supplies, medicines, etc.

Referring now also to FIG. 9, one of many alternate embodiments of the kiosk for resource distribution 10 where the kiosk for resource distribution 10 may be largely automated is shown. As shown in FIG. 9, the housing 12 may resemble a pavilion. The housing 12 may comprise a central stand/display area 700. The stand/display area 700 may include at least one TV 300. Additionally, the stand/display area 700 may include at least one vending machine 510. In the embodiment shown in FIG. 9, there are two vending machines 510. One of the vending machines 510 may dispense at least one or both product water, and/or cooled product water, via a product water spigot 146 and/or cooled product water spigot. The other vending machine 510 may be used to dispense commercial beverages, snacks, nutrition supplements, etc. The source water reservoir 124, product water reservoir 144, water distillation device 122, fuel requiring element 102, and any other relevant components may be housed inside the stand/display 700. Some embodiments may include at least one door 16 which provides access to the interior of the stand/display 700 to allow for maintenance, service, etc.

As shown in FIG. 9, the kiosk for resource distribution 10 may include one or more solar panels 702. The solar panels 702 may be used to supplement power generated by the at least one fuel requiring element 102 or may be used in place of the fuel requiring element 102 in some embodiments. As shown in FIG. 9, the solar panel 702 may be located on the roof of the housing 12 to maximize sun exposure. In some embodiments, the solar panel 702 may be disposed on the roof of an awning 19. This may be desirable because the awning 19 may be much easier to reposition, if necessary, than the housing 12 of the kiosk for resource distribution 10.

In some embodiments, a wind turbine (not shown) may also be included. The wind turbine may be used in place of the fuel requiring element 102 or the solar panel 702 or may be used in any combination therewith. In some embodiments, the kiosk for resource distribution 10 may be tied to a power grid. In such embodiments, the kiosk for resource distribution 10 may not include a fuel requiring element 102, solar panel 702, or other power generating device. In some other embodiments where the kiosk for resource distribution 10 is grid tied, a fuel requiring element 102, solar panel 702, or other power generating device may be included as a back up or supplement to grid power.

As shown in FIG. 9, the kiosk for resource distribution 10 may also include an internet connection 411 and in these embodiments, the kiosk for resource distribution 10 may function as a WiFi hot spot. In some embodiments, the kiosk for resource distribution may also include a FAX machine (not shown), phone 704, bank of phones 704, etc. The phone 704 or phones 704 may, for example, be pay phones 704. In some embodiments, the kiosk for resource distribution 10 may also include at least one laundering element (not shown) to clean and/or dry clothing, linens, etc. In some embodiments, such as the substantially automated embodiment of the kiosk for resource distribution 10 shown in FIG. 9, the laundering element may include a monetarily operated mechanism. In such embodiments, the monetarily operated mechanism may enable a kiosk for resource distribution 10 to charge for laundry services.

In some embodiments, such as the embodiment shown in FIG. 9, various equipment may be rented out from the kiosk for resource distribution 10. Such equipment may be outdoor gear, electronics, batteries, bicycles, etc. The equipment may be lent out by the entrepreneur or, as may be the case in the example embodiment in FIG. 9, an automated process. Especially in the latter scenario, the equipment may include an identifier such as an RFID tag which aids in tracking rental and return of the equipment. In some embodiments, equipment from one kiosk for resource distribution 10 may be returned to another kiosk for resource distribution 10 which shares equipment resources with the kiosk for resource distribution 10 from which the piece of equipment was rented.

Figure 10:
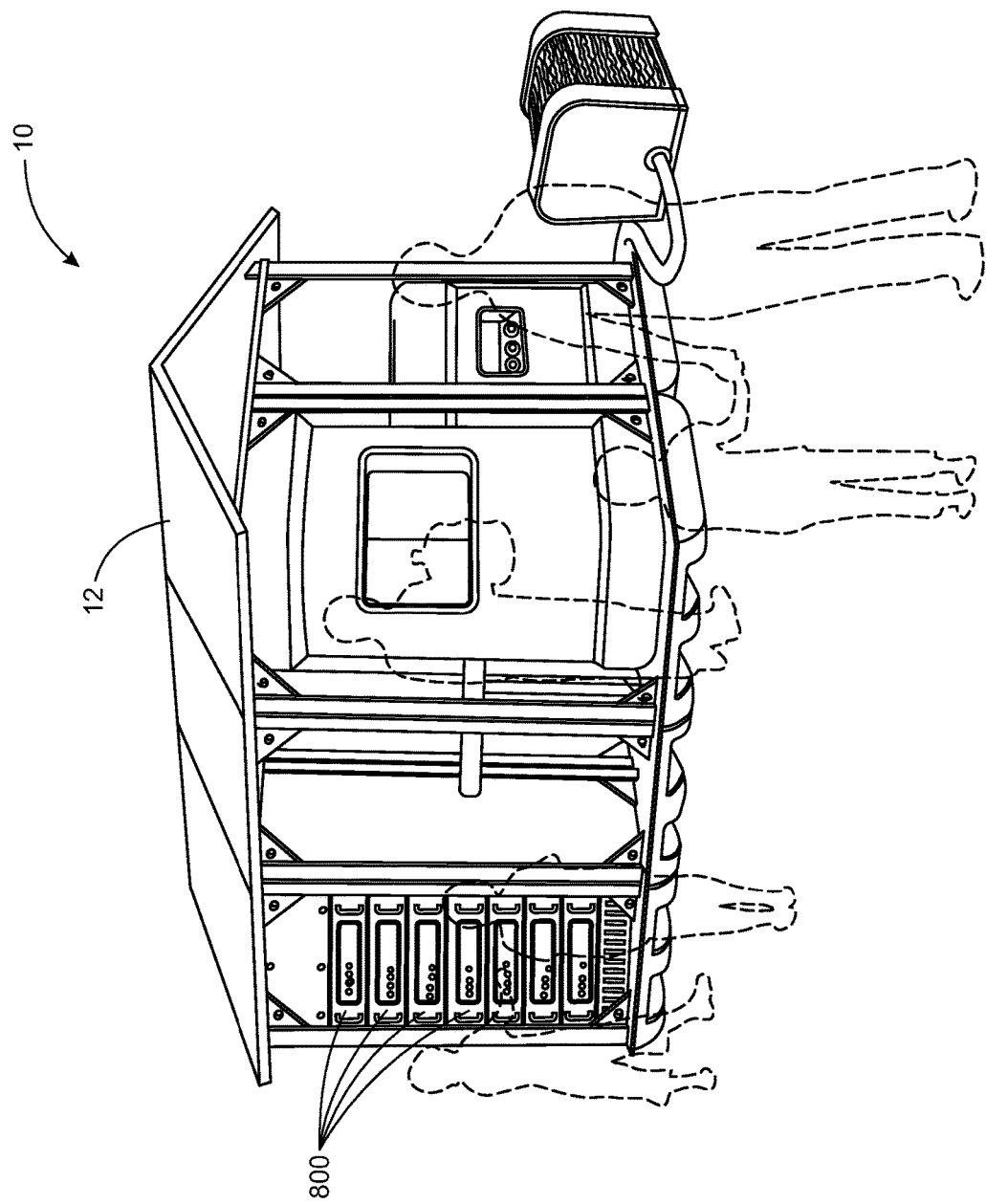
FIG. 10 is a view of another example of a kiosk for resource distribution in accordance with an embodiment of the present disclosure.

Referring now also to FIG. 10 shows another embodiment of a kiosk for resource distribution 10. As shown in FIG. 10, the kiosk 10 may include a shed type housing 12 open on all sides. Additionally, as shown in FIG. 10, the kiosk for resource distribution 10 may also include at least one charging station 800 to make the kiosk for resource distribution 10 a source for portable energy. The charging station 800 may allow patrons to use the kiosk for resource distribution 10 to charge any number of items, including, but not limited to, batteries such as portable batteries, cell phones, laptops, flashlights, vehicles, media players, GPS devices, etc. In some embodiments, the charging station 800 may include a number of power strips which a user may plug into and draw power from. Other embodiments may feature USB charging ports, etc. In some embodiments, the kiosk for resource distribution 10 may charge batteries or various other devices which may then be rented out to the local population. Various embodiments of the embodiment shown in FIG. 10 may include one or more features shown and described herein with respect to FIGS. 1-9.

Figure 11:
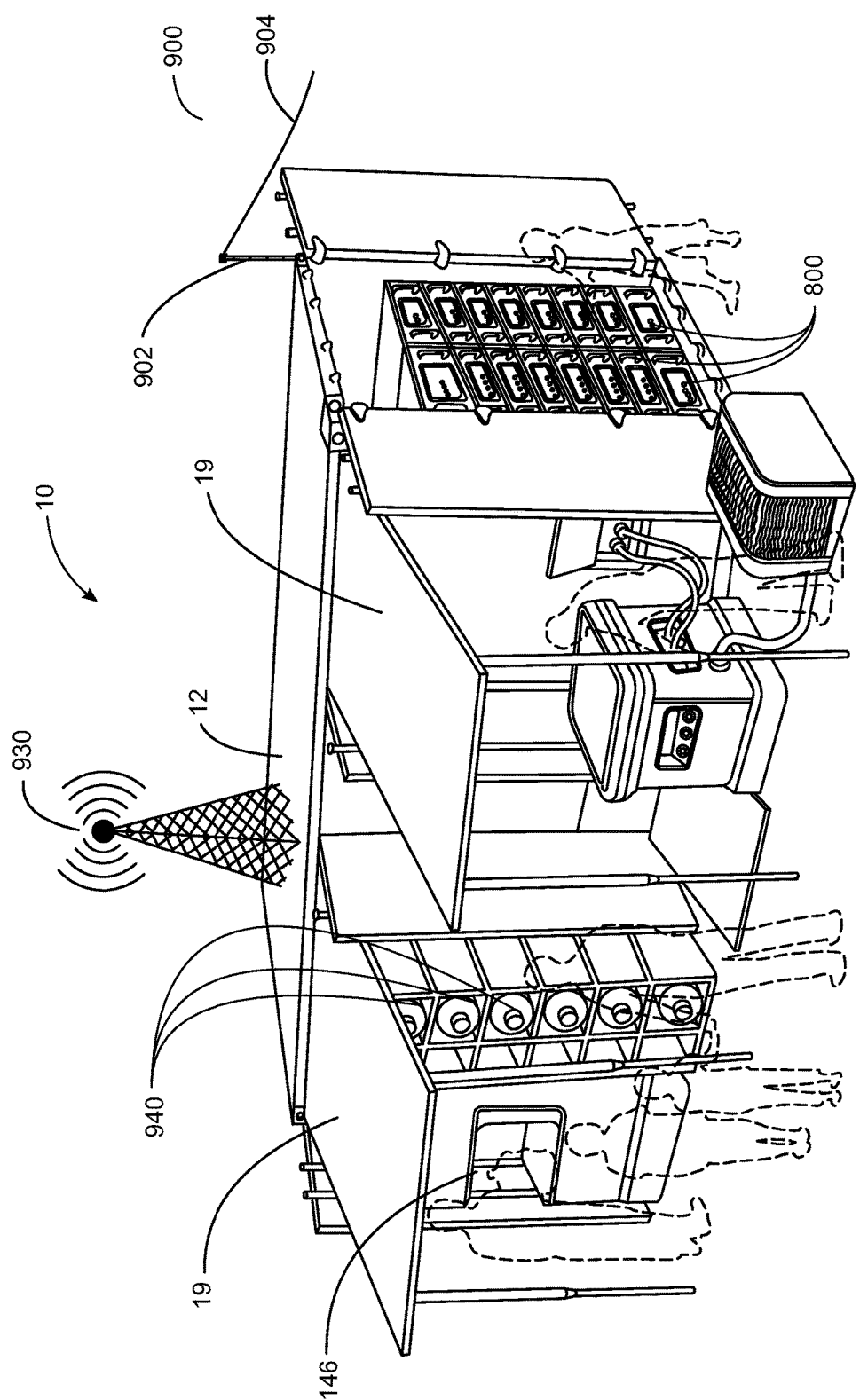
FIG. 11 is a view of another example of a kiosk for resource distribution in accordance with an embodiment of the present disclosure.

Referring now also to FIG. 11, a number of charging stations 800 are shown in one of many possible embodiments where the housing 12 is a shipping container. In addition to charging stations 800, the kiosk for resource distribution 10 may provide power or other services via a mini-grid 900. As shown in FIG. 9, the mini-grid 900 includes at least one or more utility poles 902. The utility poles 902 may support at least one utility cable 904. The mini-grid 900 may, for example, be used to provide power to light surrounding dwellings, street lights, stores, study spaces, etc. In some embodiments, the mini-grid 900 may be used to electrify a small village.

Some embodiments, such as the one shown in FIG. 11, may also include a cellular communications tower 930. The cellular communications tower 930 may be used to provide cell phone service to an area in the vicinity of the kiosk for resource distribution 10. In some embodiments, the cellular communications tower 930 may include a daisy chain link to other cellular stations or other cellular communications towers 930 on other kiosks for resource distribution 10. In some embodiments, the kiosk for resource distribution 10 may include a broadcasting tower (not shown).

In some embodiments, the kiosk for resource distribution 10 or at least one component of the kiosk for resource distribution 10 may communicate information to an external device via the cellular communication tower 930. In other embodiments, communication of information may be accomplished via a satellite link, internet link, short wave radio, ultra high frequency radio, etc. This may also allow the kiosk for resource distribution 10 to be used, for example, as a bush pilot tower. This may allow remote monitoring of the kiosk for resource distribution 10. Remote monitoring may be desirable for a variety of reasons, including, but not limited to, determining if a problem requiring maintenance exists with the kiosk for resource distribution 10, if a vending machine 510 or inventory requires restocking, or determining where a stolen element of the kiosk for resource distribution 10 was taken.

As shown in FIG. 11, the kiosk for resource distribution 10 may include a storage area 100 for a number of consumer product water containers 940. The consumer product water containers 940 may be stored full or may be picked up by the customer and filled from the product water spigot 146 or cooled product water spigot. In some embodiments, the consumer product water containers 940 may be lent out in a deposit-refund system to encourage reuse. In other embodiments the consumer product water containers 940 may be a product sold by a kiosk for resource distribution 10. In some embodiments, the consumer product water containers 940 may be brought to a customer's residence by staff of the kiosk for resource distribution 10 as part of a delivery service. In some embodiments, the kiosk for resource distribution 10 may provide consumer product water container 940 sanitation. In a specific embodiment, waste heat from a fuel requiring element 102 may be used to generate steam to steam clean consumer product water containers 940.

Figure 12:
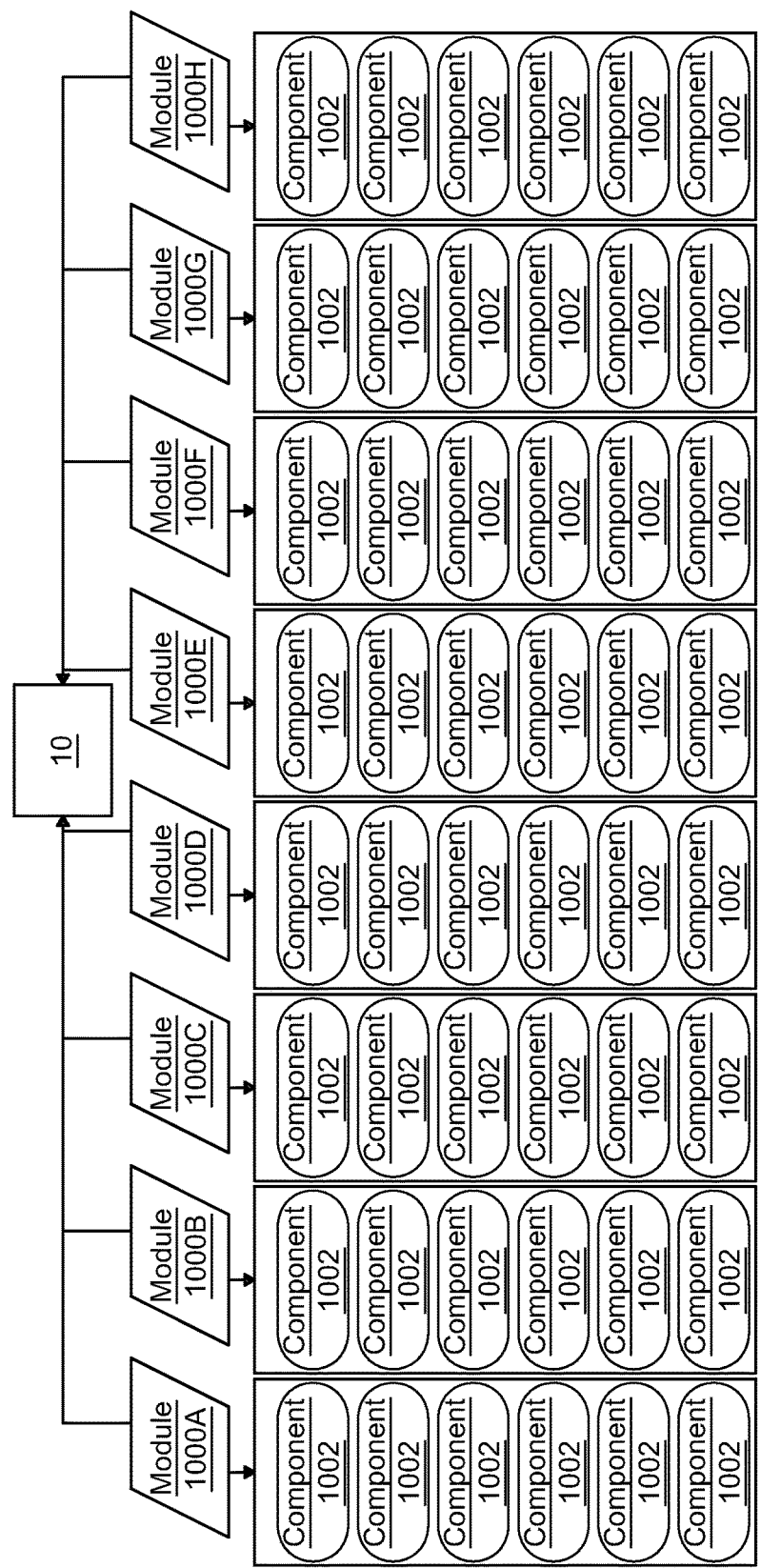
FIG. 12 is an example block diagram of a kiosk for resource distribution which comprises a number of modules each of which being comprised of a number of components in accordance with an embodiment of the present disclosure.

Referring also to FIG. 12, an example block diagram is shown. As shown, the block diagram illustrates a kiosk for resource distribution 10 where the kiosk for resource distribution 10 is built up from one or a number of modules 1000. As shown, the kiosk for resource distribution 10 in FIG. 12 includes eight different modules 1000 (module 1000A-1000H). Each of the modules 1000 may include of a number of different components 1002. In the example block diagram each module 1000 includes six components 1002. In some embodiments, each module 1000 may not include the same number of components 1002. In some embodiments, at least one module 1000 may include more than six components 1002. In some embodiments, at least one module 1000 may include less than six components 1002. In some embodiments, modules 1000 may include a number of components 1002 and may or may not include a number of additional, optional components 1002. In some embodiments, at least one component 1002 may include one or a number of options (not shown in FIG. 12) which may or may not be included in the component 1002.

The modules 1000 may include all components 1002 necessary to perform or implement a core function or core usage of the kiosk for resource distribution 10. The modules 1000 may be standardized and easily assembled on site without the need for heavy machinery, advanced technology, or skilled workers. The modules 1000 may be sized such that they may easily be transported. In some embodiments, use of modules 1000 may increase deployability of the kiosk for resource distribution 10 because the individual modules 1000 may be made light enough to be carried to location by a helicopter. In some embodiments, the modules 1000 or specific modules 1000 may come pre-assembled. Each module 1000 may be constructed such that it may easily interface or intermix with any other module 1000 when put together in a housing 12. In some embodiments the components 1002 of each module 1000 may not be pre-assembled. In such embodiments, the components 1002 may be arranged on site, for example, in what is determined to be the most spatially efficacious manner. In some embodiments, at least one module 1000 may come as a kit of parts.

The modules 1000 allow the kiosk for resource distribution 10 to be easily customized or adjusted to suit the needs of an intended use, geographical location, etc. or to best use available local resources. Depending on the intended use, geographical location, available resources, etc. one may pick and chose from a number of different possible modules 1000, selecting modules 1000 which are optimally suited. Since any module 1000 may easily interface with any other module 1000, there is no need to completely redesign a kiosk for resource distribution 10 for every different geographical location, use, etc. For a specific example, a kiosk for resource distribution 10 to be used in a disaster relief scenario may include modules 1000 for providing power, clean water, and medical care. Other possible modules 1000 may be used for education, entertainment, retail, culinary, fuel production, scientific purposes, storage, processing/manufacture (e.g. tailoring, welding, butchering, seed preparation, etc.), communication, or any other purpose. The modules 1000 may be mixed and matched to easily build up a kiosk for resource distribution 10 which best serves any specific scenario.

Figure 13:
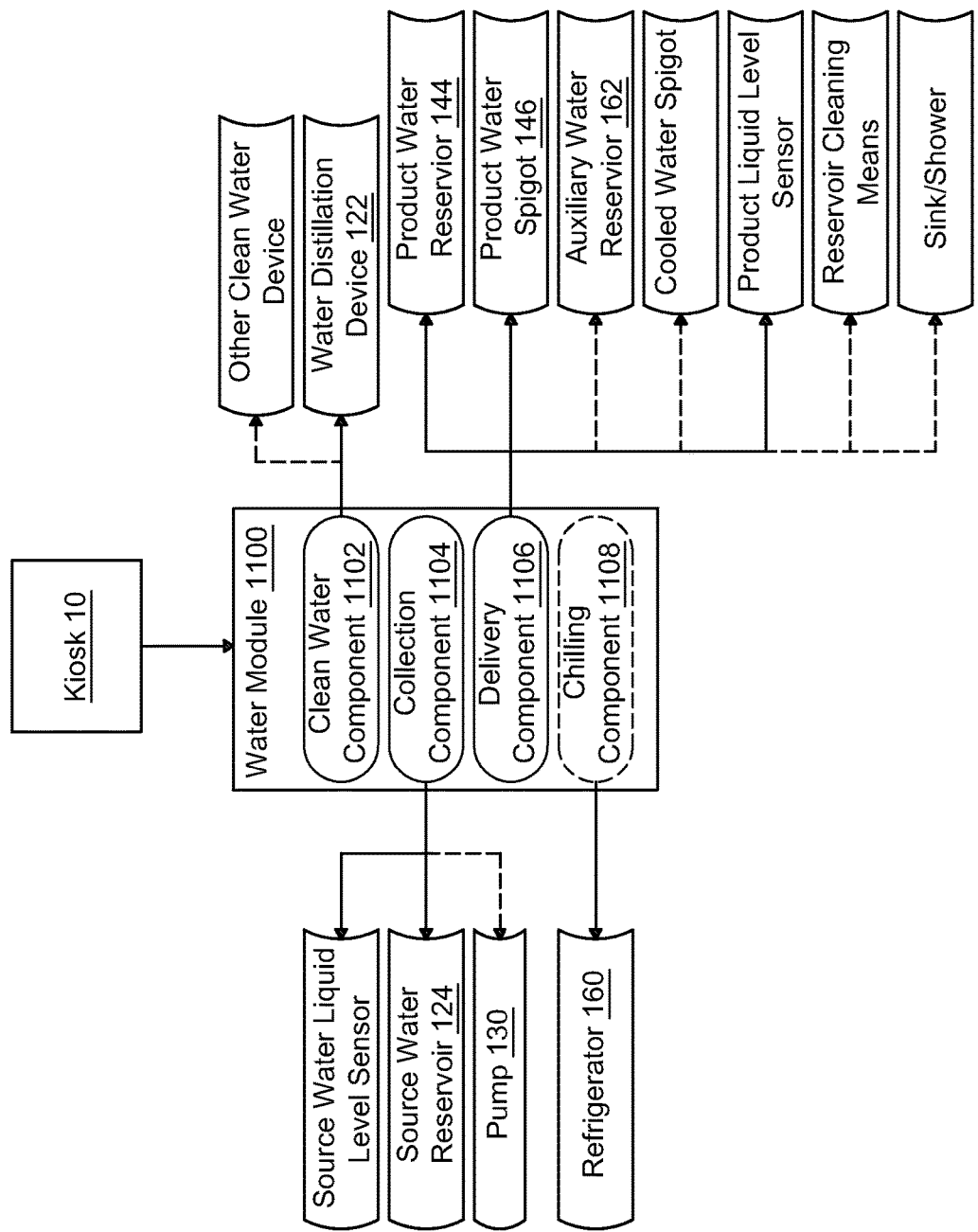
FIG. 13 is an example block diagram of an example module of an example kiosk for resource distribution in accordance with an embodiment of the present disclosure.

Referring also to FIG. 13 an example block diagram of an example water module 1100 for a kiosk for resource distribution 10 is shown. A water module 1100 may be included in a kiosk for resource distribution 10 for example, for use in areas with limited or no access to safe water. In areas with sufficient access to safe water, a water module 1100 may not be included in the kiosk for resource distribution 10. In some embodiments, the water module 1100 may be substituted with another module 1000 which better serves the needs of a specific location.

Still referring to FIG. 13, as shown, the example water module 1100 includes four components 1002 one of which is optional. The example water module 1100 includes a clean water component 1102, collection component 1104, delivery component 1106 and an optional chilling component 1108. As shown in the example embodiment of the water module 1100, the clean water component 1102 includes a water distillation device 122. In some embodiments, the clean water component 1102 may include another clean water device which is not a water distillation device 122. In some embodiments, the other clean water component 1102 may be a second water distillation device 122. In some embodiments, the clean water component 1102 may include a single clean water device which is not a water distillation device 122. In some embodiments, the clean water component 1102 may be made up of other elements in addition to or in place of those shown in FIG. 13.

The water module 1100 may also include a collection component 1104 as shown in the example block diagram in FIG. 13. As shown, the collection component 1104 may include a source water reservoir 124. The source water reservoir 124 may be any type of reservoir, such as, but not limited to those described above. The exemplary collection component 1104 includes a source water liquid level sensor. The collection component 1104 may also optionally include a pump 130. In various embodiments, the collection component 1104 may include other elements in addition to or in place of those shown in FIG. 13.

The example water module 1100 in FIG. 13 also includes a delivery component 1106 to deliver the clean, product water to a consumer. As shown, the example delivery component 1106 includes a product water reservoir 144. The product water reservoir 144 may be any type of reservoir, such as, but not limited to those described above. A product water spigot 146 and product liquid level sensor are also included in the delivery component 1106 of the example water module 1100 shown in FIG. 13. In some embodiments, the delivery component 1106 may optionally include an auxiliary water reservoir 162 which may be any type of reservoir, such as but not limited to those described above. The delivery component 1106 may also include a cooled water spigot and a reservoir cleaning means.

In some embodiments, the water module 1108 may additionally include other options as additional components 1002. For purposes of example, an optional chilling component 1108 is included in the water module 1100 in FIG. 13. The chilling component 1108 in the example block diagram includes a refrigerator 160. In some embodiments, the refrigerator 160 may be included in a separate module 1000. In some embodiments, other components 1002 may be included. Various connectors, conduits, electrical wiring, etc. may also be included in the water module 1100 to couple various components 1002 of the water module 1100 together and to interface with another module 1000 or modules 1000.

Figure 14:
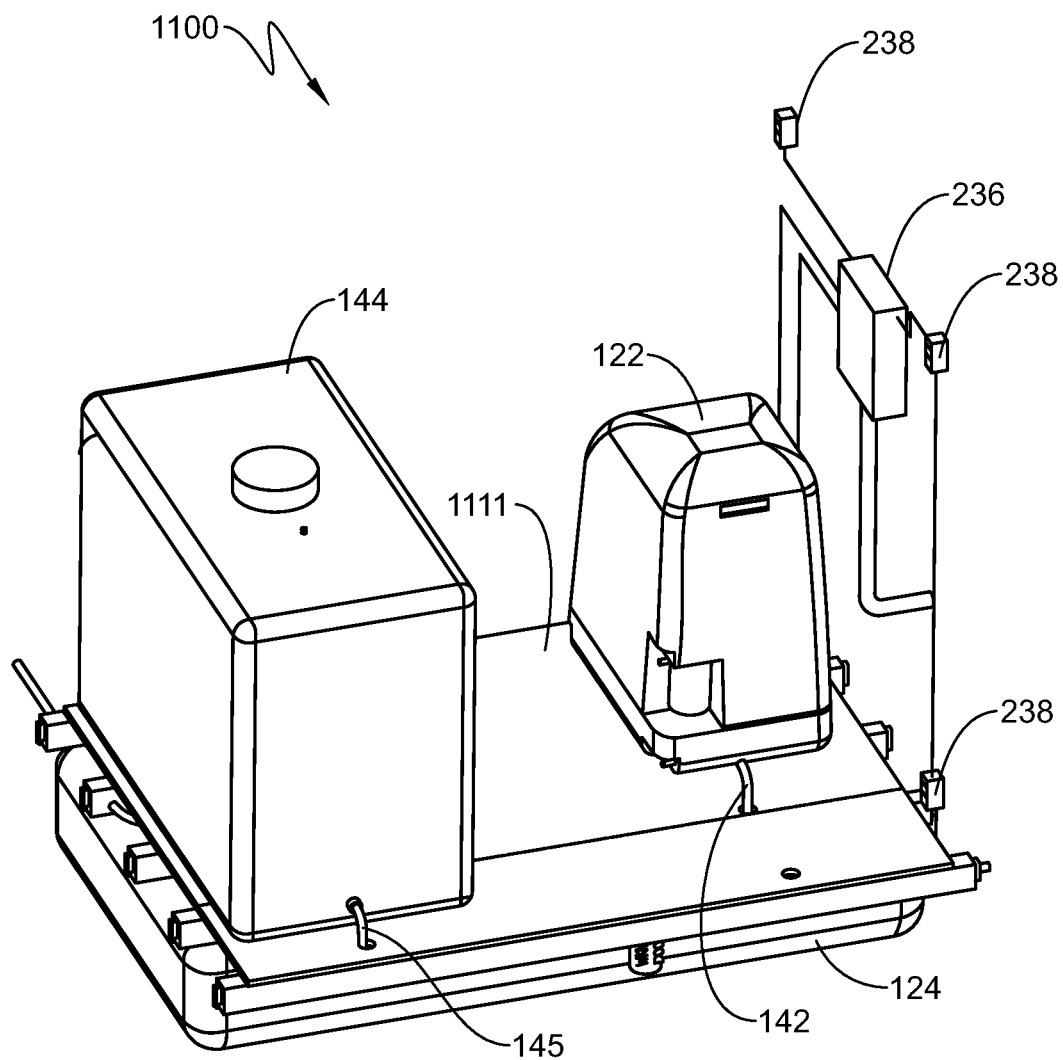
FIG. 14 is a view of an example water module in accordance with an embodiment of the present disclosure.

Referring now also to FIG. 14 an isometric view of an example water module 1100 is shown. As shown, the example water module 1100 includes a floor 1111. Under the floor 1111 a source water reservoir 124 is disposed. The water module 1100 also includes a water device which in the example embodiment is a water distillation device 122. The water device may be in communication with the source water reservoir 124 via a source-to-still intake conduit 142. As shown, a product water reservoir 144 may also be included, in some embodiments, in the example water module 1100 in FIG. 14. The product water reservoir 144 may be in communication with water device via a still-to-product reservoir conduit 145. In some embodiments where a large capacity for safe water production is desirable, multiple water modules 1100 such as the water module 1100 shown in FIG. 14 may be included in the kiosk for resource distribution 10.

An electrical distribution box 236 and a number of outlets 238 are also visible in FIG. 14. In some embodiments, the electrical distribution box 236 and outlets 238 may not be included as part of the water module 1100. For example, in some embodiments, they may be included as part of a battery bank module 1200 (see FIG. 15) or power module 1600 (see FIG. 16). In some embodiments, the outlets 238 may be included as part of an interior module (not shown).

Figure 15:
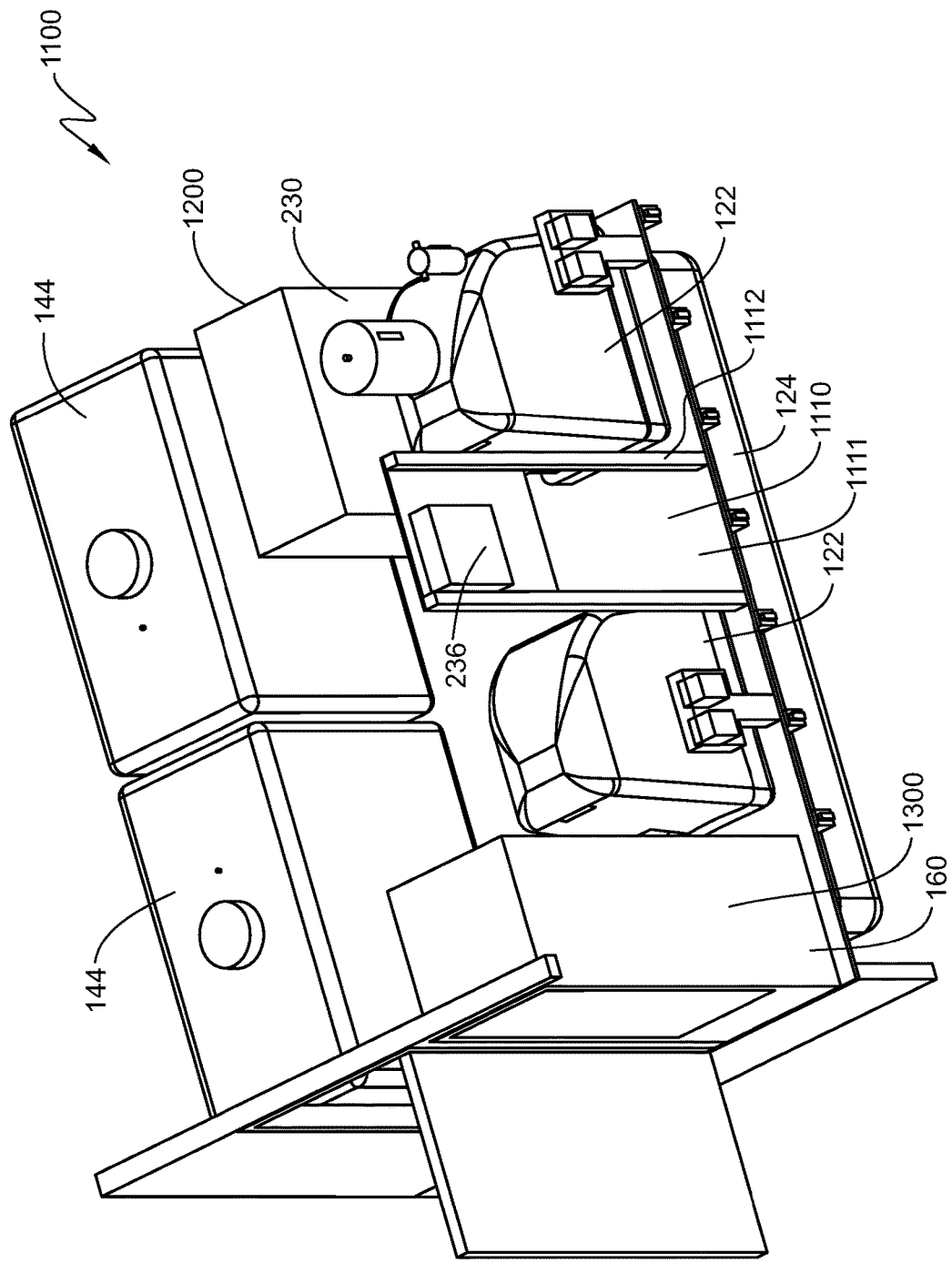
FIG. 15 is a view of an example water module in accordance with an embodiment of the present disclosure.

Referring now also to FIG. 15, an isometric view of an example water module 1100, battery module 1200, and refrigeration module 1300 is shown. The example water module 1100 shown includes a frame component 1110. As shown, the example water module 1110 includes a floor 1111, but does not include walls. The frame component 1110 instead includes a stand structure 1112. In some embodiments, walls may be included as part of an interior module (not shown). In some embodiments, the water module 1100 may not include the frame component 1110. In such embodiments, the floor 1111 and stand structure 1112 may be included as part of an interior module and not as part of the water module 1100. In some embodiments, the interior module may include all of the wall materials 15, flooring 17, lights, 240 outlets 238, etc. of the kiosk for resource distribution 10.

Under the floor 1111 of the example water module 1100 is a source water reservoir 124. As shown, the example water module 1100 includes two water devices which are water distillation devices 122. Some embodiments may only include a single water device (see FIG. 14) or more than two water devices. The example water module 1100 also includes two product water reservoirs 144. The water module 1100 may also include plumbing such as the source-to-still intake conduit 142 (see FIG. 14) and still-to-product reservoir conduit 145 (see FIG. 14). In some embodiments, the plumbing may be integrated into the frame component 1110. In some embodiments, the water module 1100 may include a water output metering system, a sink, a shower, various spigots etc. In some embodiments, a source water pump 130 and hose may also be included as part of the water module 1100.

An embodiment of a battery bank module 1200 is also shown in FIG. 15. In some embodiments, the battery bank module 1200 includes a battery bank 230. The battery bank 230 may be connected to a power source to charge the battery bank 230 of the battery bank module 1200. The power source may include, but is not limited to, one or more of the following: an electrical grid, fuel requiring element 102, or any other suitable power source. The battery bank module 1200, in some embodiments, includes an electrical distribution box 236 which may be coupled to the stand structure 1112 in the example embodiment. The refrigeration module 1300 shown in FIG. 15 includes a refrigerator 160. In some embodiments, the refrigeration module 1300 may also include a freezer, segregated medical refrigeration section 168, etc.

Figure 16:
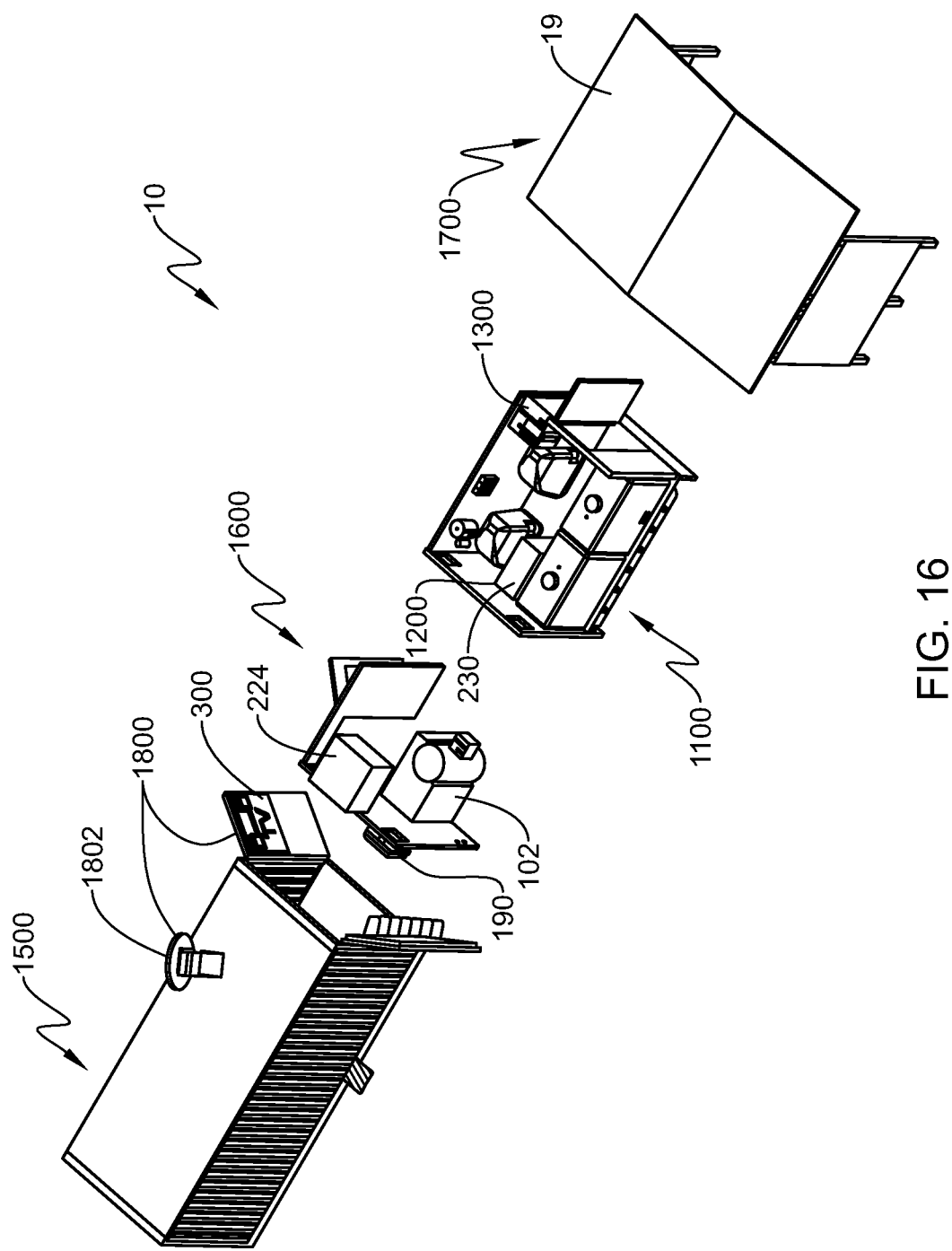
FIG. 16 is an exploded view of an example modular kiosk for resource distribution in accordance with an embodiment of the present disclosure.

Referring now also to FIG. 16, an exploded view of an example kiosk for resource distribution 10 which includes a number of different modules 1000 is shown. As shown, the kiosk for resource distribution 10 includes a structure module 1500, a power module 1600, a water module 1100, battery bank module 1200, refrigeration module 1300, an awning module 1700, and a communication module 1800. A kiosk for resource distribution 10 assembled from the structure module 1500, power module 1600, water module 1100, battery bank module 1200, refrigeration module 1300, awning module 1700, and communication module 1800 as shown may be best suited for a location with limited or no access to electricity and safe water.

Still referring also to FIG. 16, as shown the structure module 1500 is a housing 12. Specifically, the shown structure module 1500 is a 20×8×8 foot shipping container. In some embodiments, the structure module 1500 may be a structure which is pre-existing on site. In some alternate embodiments, the structure module 1500 may be a structure which is assembled out of materials readily available on site (e.g. concrete masonry units).

As mentioned above, in some embodiments, modules 1000 may be provided in a standard size. This may be desirable/beneficial for many reasons, including, but not limited to, it may allow the modules 1000 to be easily placed into the structure module 1500 when the modules 1000 are conglomerated into the kiosk for resource distribution 10. This may also allow the kiosk for resource distribution 10 to be quickly constructed. In the example embodiment, modules 1000 are sized to be placed/slid inside the 20×8×8 shipping container.

In various embodiments, the structure module 1500 may be constructed such that minimal modification is needed. In some embodiments, the structure module 1500 may only need to have openings cut into the sides of a housing 12 for electrical, plumbing, natural light, ventilation, and various fittings such as exterior lighting fittings. The various fittings may be pre-assembled such that they need only to be welding or otherwise coupled to the structure module 1500.

Still referring also to FIG. 16, as shown, some embodiments of the power module 1600 include a fuel requiring element 102 which in some embodiments is a Stirling engine power generator. In other embodiments, the power module 1600 may not include a fuel requiring element 102 or may include a fuel requiring element 102 which is not a Stirling engine power generator. In some embodiments, the power module 1600 may include a radiator 224 which, when the kiosk for resource distribution 10 is assembled, may reside on the roof of the structure module 1500. In some embodiments, the power module 1600 may also include at least one oven 190. In some embodiments, the oven 190 may not be included as part of the power module 1600 but as part of its own module 1000. As shown, in some embodiments, the oven 190 may receive heat from waste heat of the fuel requiring element 102. When assembled the oven 190 may project out of a side of the structure module 1500 so that it may be used from the exterior of the kiosk for resource distribution 10. In some embodiments, the power module 1600 or a different module 1000 of a kiosk for resource distribution 10 may include other mechanism or method of utilizing waste heat (such as, but not limited to those described above) from a fuel requiring element 102.

In some embodiments, the power module 1600 may include any number of additional components 1002. For example, in some embodiments, the power module 1600 may include at least one fuel storage tank 104. In some embodiments, the power module 1600 may include batteries (not shown) for startup of a power generating element. In some embodiments, the battery bank 230 may be included as part of the power module 1600. In some embodiments, the power module 1600 may also include cabling and hardware for a mini-grid. In still other embodiments, the power module 1600 may include, for example, rechargeable lighting units which may be given, rented, sold to the local population. In some embodiments, the power module 1600 may include a charging station 800.

The water module 1100, battery bank module 1200, and refrigeration module 1300 are the same as the embodiment shown in FIG. 15. The frame component 1110 of the water module 1100, however, includes walls instead of the stand structure 1112. The water module 1100, battery bank module 1200, and refrigeration module 1300 may be placed into the structure module 1500 after the power module 1600 has been placed into the structure module 1500. As mentioned above, each module 1000 may be constructed such that it may easily interface with other modules 1000. In various embodiments, for example, the power module 1600 may be constructed such that any plumbing, electrical wiring, walls, etc. line up and/or may easily be attached to plumbing, electrical wiring, walls, etc. of the water module 1100, battery bank module 1200 and refrigeration module 1300.

As shown, and still referring also to FIG. 16, some embodiments include an awning module 1700. The example awning module 1700 includes an awning 19. In some embodiments, the awning module 1700 may include additional components 1002 such as seating 502, benches, tables, etc. In some embodiments, seating 502, tables, benches, etc. may be included in a separate module 1000.

Referring also to FIGS. 16-19, the awning module 1700, in some embodiments, may not be disposed on or in the structure module 1500, but may be an auxiliary part of the kiosk for resource distribution 10. In some embodiments, the awning module 1700 may differ. For example, the awning module 1700 may be coupled to the structure module 1500 such that it may fold out, slide out, roll out, etc. from the structure module 1500. In some embodiments, the awning module 1700 may perform the function of a structure module 1500. In such embodiments, all of the various modules 1000 in a particular kiosk for resource distribution 10 may be enclosed by an awning module 1700. In some embodiments, the awning module 1700 may be easily repositioned or broken down and stored inside the kiosk for resource distribution 10.

In some embodiments, the awning module 1700 may be assembled from a kit of parts on site. The awning module 1700 may be used to provide a shaded or sheltered area around the kiosk for resource distribution 10. Additionally, the awning module 1700 may be used to expand the overall size of the kiosk for resource distribution 10. This may be desirable in entrepreneurial applications for instance because it creates a bigger area to display goods and commodities.

The embodiment depicted additionally includes a communication module 1800. In the example embodiment, the communication module 1800 includes a satellite receiver 1802. The satellite receiver 1802 may provide one way or two way communication. In the example embodiment, the satellite receiver 1802 may be used to provide a wide range of channels for a TV 300 which in the example embodiment is also included in the communication module 1800. The satellite receiver 1802 may be used for a number of other applications, such as but not limited to telephone, radio, internet, etc. In some embodiments, the communications module 1800 may provide other forms of wireless digital connectivity. For example, some embodiments of the communications module 1800 may include a cellular communications tower 930. Other embodiments of the communications module 1800 may be configured to provide WiFi hotspot internet access.

Referring still to FIGS. 16-19 in some embodiments, the roof of the structure module 1500 may be removed. In some embodiments, the power module 1600 is disposed inside the structure module 1500 and at an end of the structure module 1500. As shown, the oven 190 of the power module 1600 extends out of the structure module 1500 through the side of the structure module 1500. The water module 1100, battery bank module 1200, and refrigerator module 1300 are also in their assembled location in the kiosk 10. As shown, the water module 1100, battery bank module 1200, and refrigerator module 1300 take up much of the remaining interior space of the structure module 1500. The satellite receiver 1802 of the communications module 1800 is also shown in its assembled location. As shown, the awing module 1700 extends off the right end of the structure module 1700. The roof of the awning module 1700 (for example, shown in FIG. 17) may be transparent. In other embodiments, the roof of the awning module 1700 may be completely opaque or somewhat transparent.

Figure 17:
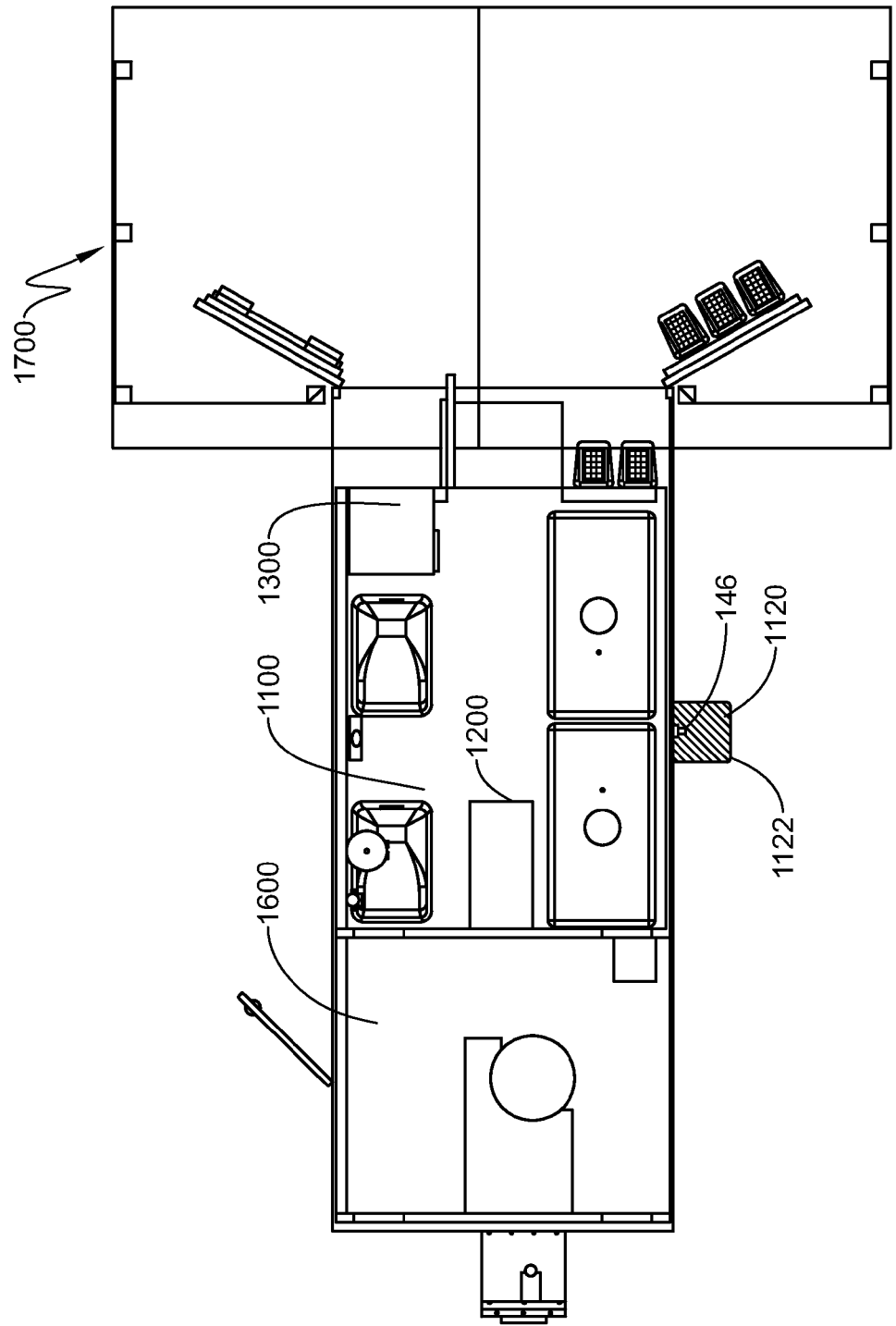
FIG. 17 is a top view of an example modular kiosk for resource distribution in accordance with an embodiment of the present disclosure.

Still referring to FIGS. 16-19, some embodiments of the water module 1100, for example, as shown in FIG. 17, include a filling station 1120. As shown, the filling station 1120 includes a product water spigot 146 which is accessible from the exterior of the structure module 1500. The filling station 1120 also includes a wire basket 1122 which may be used to hold a product water container 940 as it is being filled. In some embodiments, the filling station 1120 may include a platform or other holder to hold a product water container 940 while it is being filled. In some embodiments, a wire basket 1122 or other holder may not be included and product water containers 940 may be placed on the ground when they are being filled.

Figure 18:
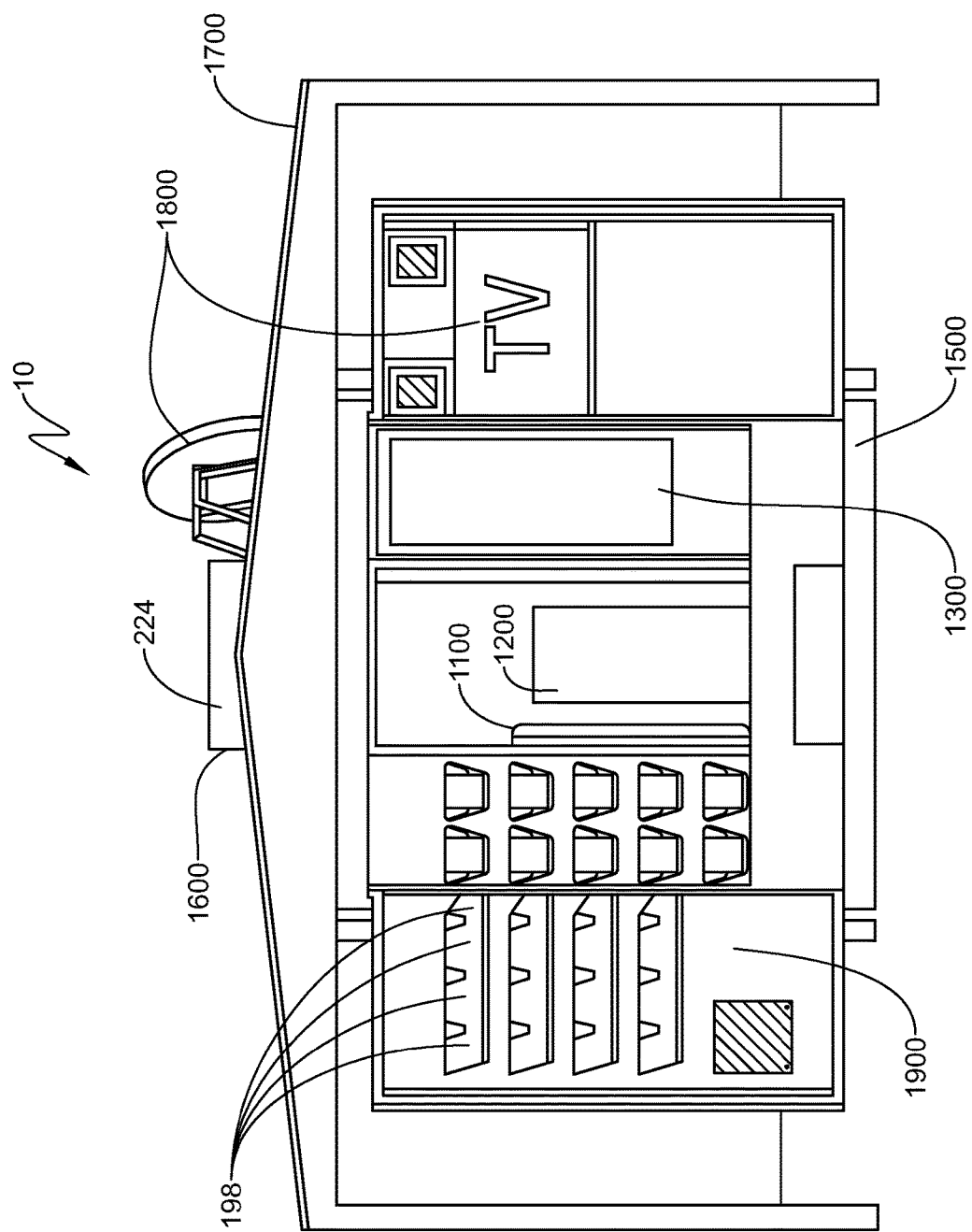
FIG. 18 is a front view of an example modular kiosk for resource distribution in accordance with an embodiment of the present disclosure.

Still referring also to FIGS. 16-18, FIG. 18 shows a front assembled view of the example kiosk for resource distribution 10 shown exploded in FIG. 16. As shown, the awning module 1700 covers the entrance to the kiosk for resource distribution 10. The refrigeration module 1300, battery bank module 1200, and water module 1100 are in their assembled locations inside of the structure module 1500. The communication module 1800 is also visible in its assembled location on the structure module 1500. The radiator 224 of the power module 1600 is also shown on the roof of the structure module 1500.

Still referring to FIGS. 16-18, as shown, an example store module 1900 occupies the extra interior space in the structure module 1500 not taken by the power module 1600, water module 1100, battery bank module 1200, and refrigeration module 1300 (for example, FIG. 18). As shown, the example store module 1900 includes shelving/displays 198 for displaying various goods. In other embodiments, the store module 1900 may include other elements such as a cash register, menus, racks for newspapers or magazines, etc. In some embodiments, the refrigeration module 1300 includes a refrigerator 160 with a door that is substantially transparent. This may be desirable in embodiments with a store module 1900 because it allows a user to see any commodities which may be for sale in the refrigerator 160.

Figure 19:
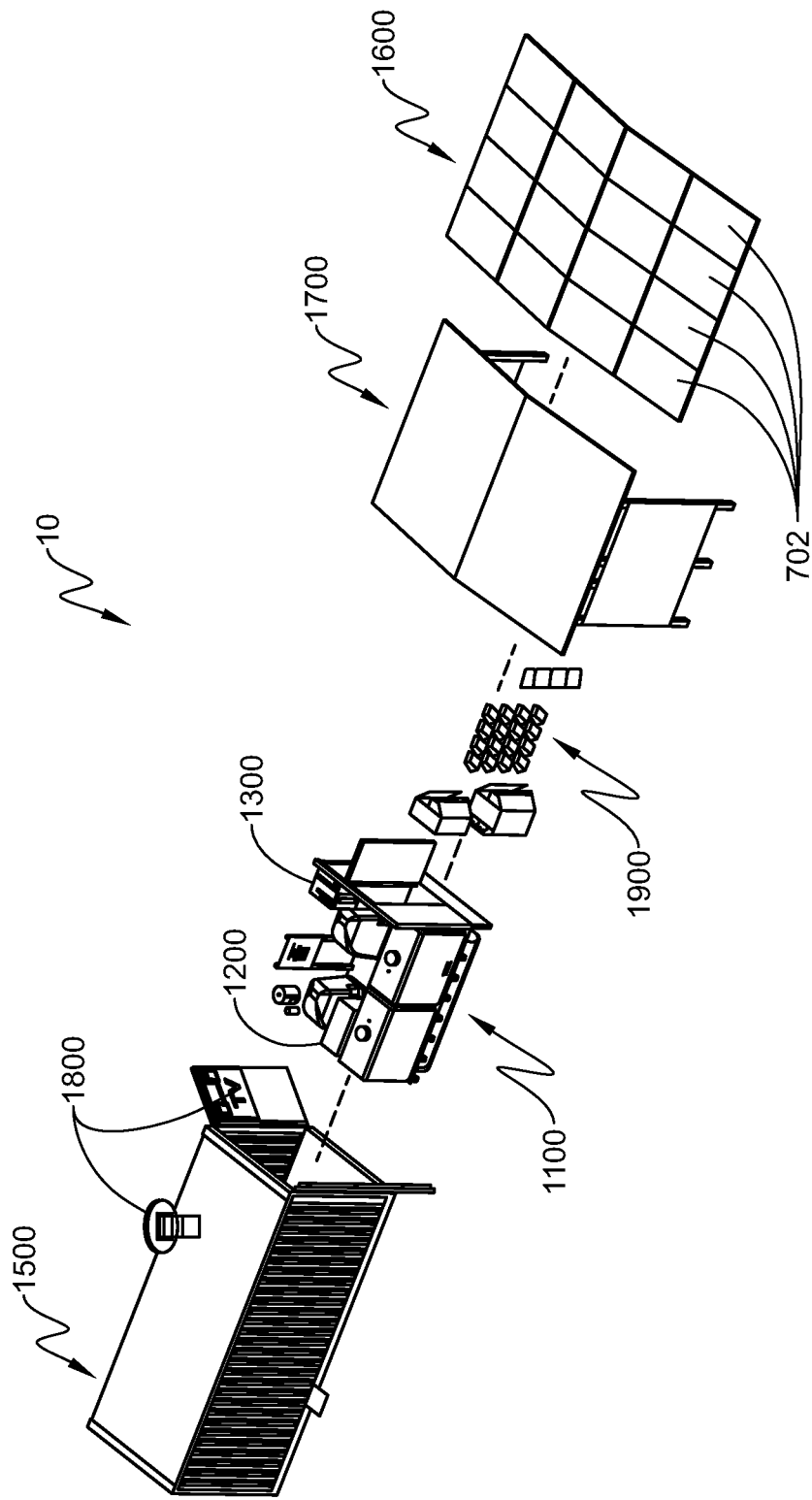
FIG. 19 is an exploded view of another example modular kiosk for resource distribution in accordance with an embodiment of the present disclosure.

Referring now also to FIG. 19 another embodiment of a kiosk for resource distribution 10 which is comprised of a number of different modules 1000 is shown. In the embodiment shown, the kiosk for resource distribution 10 includes a structure module 1500, a communication module 1800, a water module 1100, a battery bank module 1200, a refrigeration module 1300 a store module 1900, and awning module 1700, and a power module 1600.

As shown, the structure module 1500 in the example embodiment shown in FIG. 19 is a 20×8×8 shipping container similar to the structure module 1500 shown in FIGS. 16-18. The communication module 1800 is shown attached to the structure module 1500 and is the same as the communication module 1800 shown in FIGS. 16-18. The water module 1100, battery bank module 1200, and refrigeration module 1300 used in the example embodiment in FIG. 19 are the same as those used in FIG. 16. The store module 1900 is larger than that shown in FIG. 18. The awning module 1700 may be an embodiment similar to that shown and described with respect to FIGS. 16-18. In the embodiment shown, the power module 1600 may not include a fuel requiring element 102 as it does in FIGS. 16-18. The embodiment of power module shown in FIG. 18 may include at least one solar panel 702, and in some embodiments, a plurality of solar panels 702, which may be placed on the roof of the structure module 1500, roof of the awning module 1700, and/or on the ground surrounding the kiosk for resource distribution 10.

As mentioned above, by constructing the kiosk for resource distribution 10 from a number of modules 1000, it is easily adaptable to different scenarios. Depending on the scenario, one may select modules 1000 so that they best leverage available resources or best suit the local area. For example, in a scenario where ample solar energy is available, a power module 1600 which runs off solar power may be easily substituted for a power module 1600 running off a fuel requiring element 102 without needing to redesign the entire kiosk for resource distribution 10. Additionally, as shown in FIG. 19, this helps to optimally utilize the interior space of the structure module 1500. Without requiring redesigning the entire kiosk for resource distribution 10 the space occupied by the power module 1600 in FIGS. 16-18 may be easily filled by any other module 1000. In the example embodiment in FIG. 19, a larger store module 1900 is used to fill the extra space.

Figure 20:
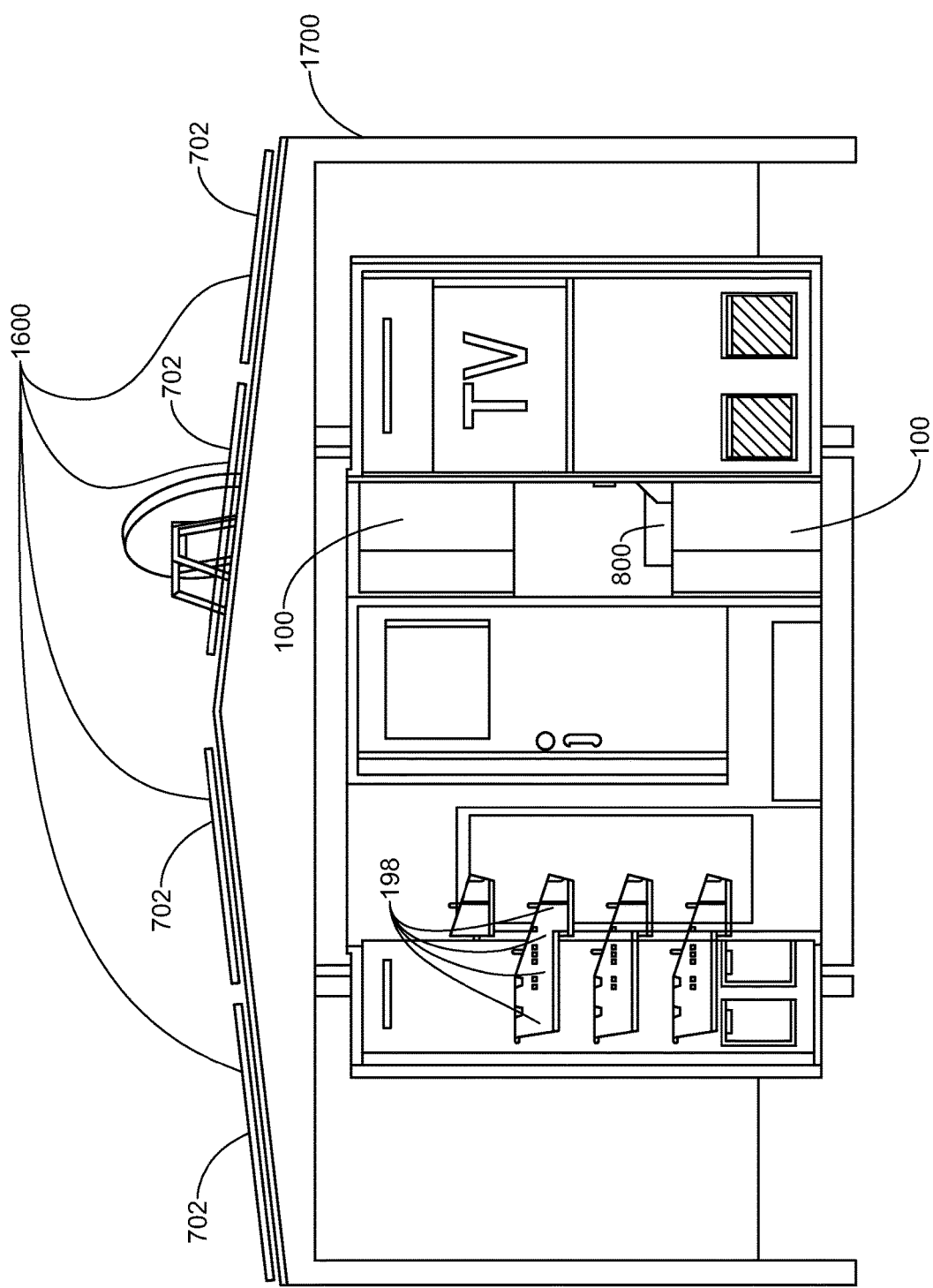
FIG. 20 is a front view of another example modular kiosk for resource distribution in accordance with an embodiment of the present disclosure.

Referring now also to FIG. 20, an embodiment of the kiosk for resource distribution 10 shown exploded apart in FIG. 19. As shown, in some embodiments, the power module 1600 may include a number of solar panels 702 which are disposed on the roof of the awning module 1700. The space created by swapping the power module 1600 with a fuel requiring element 102 for a power module 1600, which utilizes solar energy, may be used by a much larger store module 1900 than the embodiment shown in FIGS. 16-18. As shown, the store module 1900 in FIG. 20 includes extra shelving/displays 198. The store module 1900 in FIG. 20 also includes a number of storage areas 100. Additionally, the store module 1900 includes a charging station 800.

Figure 21:
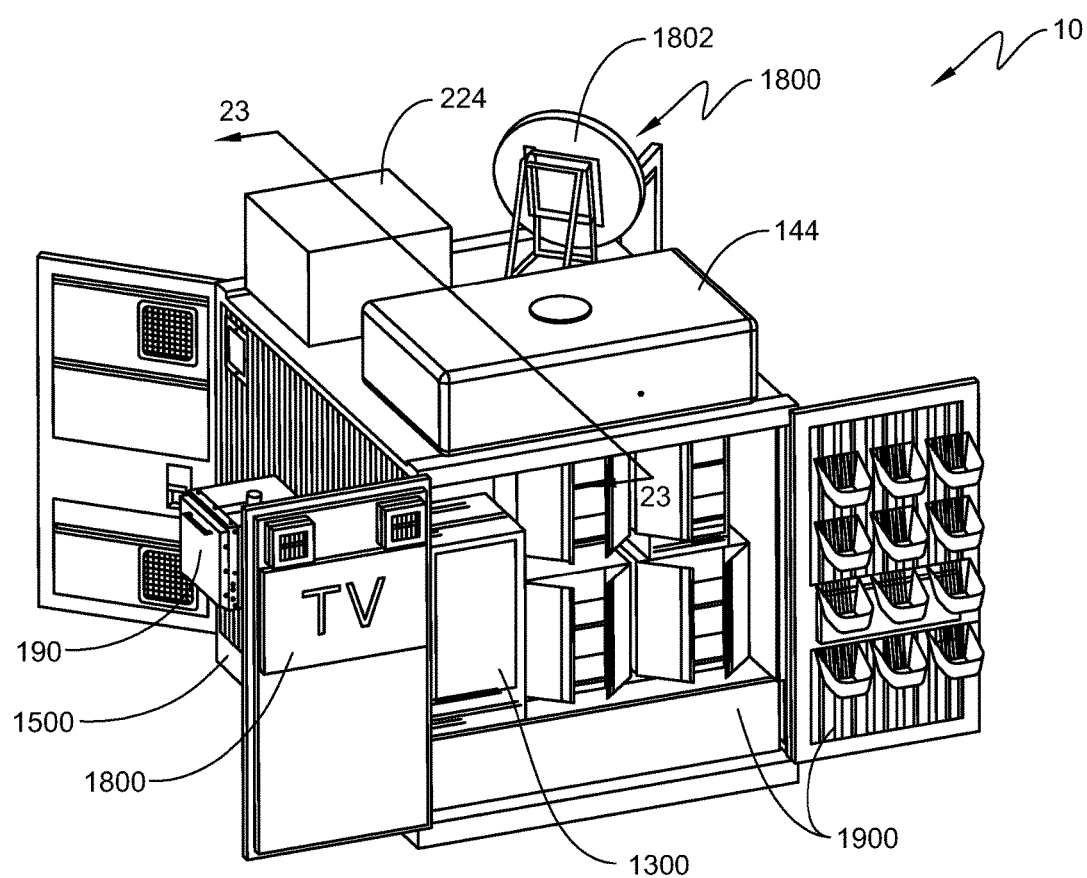
FIG. 21 is an isometric view of yet another example modular kiosk for resource distribution in accordance with an embodiment of the present disclosure.

Referring now also to FIG. 21 an example of a kiosk for resource distribution 10 where the structure module 1500 is a 10×8×8 foot shipping container is shown. As shown, some embodiments of the kiosk for resource distribution 10 include a refrigeration module 1300, a store module 1900, a communication module 1800. Some embodiments may include a radiator 224, and/or at least one oven 190 and/or at least one product water tank 144.

In contrast to the embodiments of water modules 1100 described above, the embodiment in FIG. 21 includes a single product water reservoir 144. Additionally, the product water reservoir 144 is located on the roof of the structure module 1500 to maximize space in the interior of the structure module 1500. Other embodiments of the kiosk for resource distribution 10 may include the product water reservoir 144 and/or product water reservoirs 144 on the roof of the structure module 1500 to maximize space in the interior of the structure module 1500.

Figure 22:
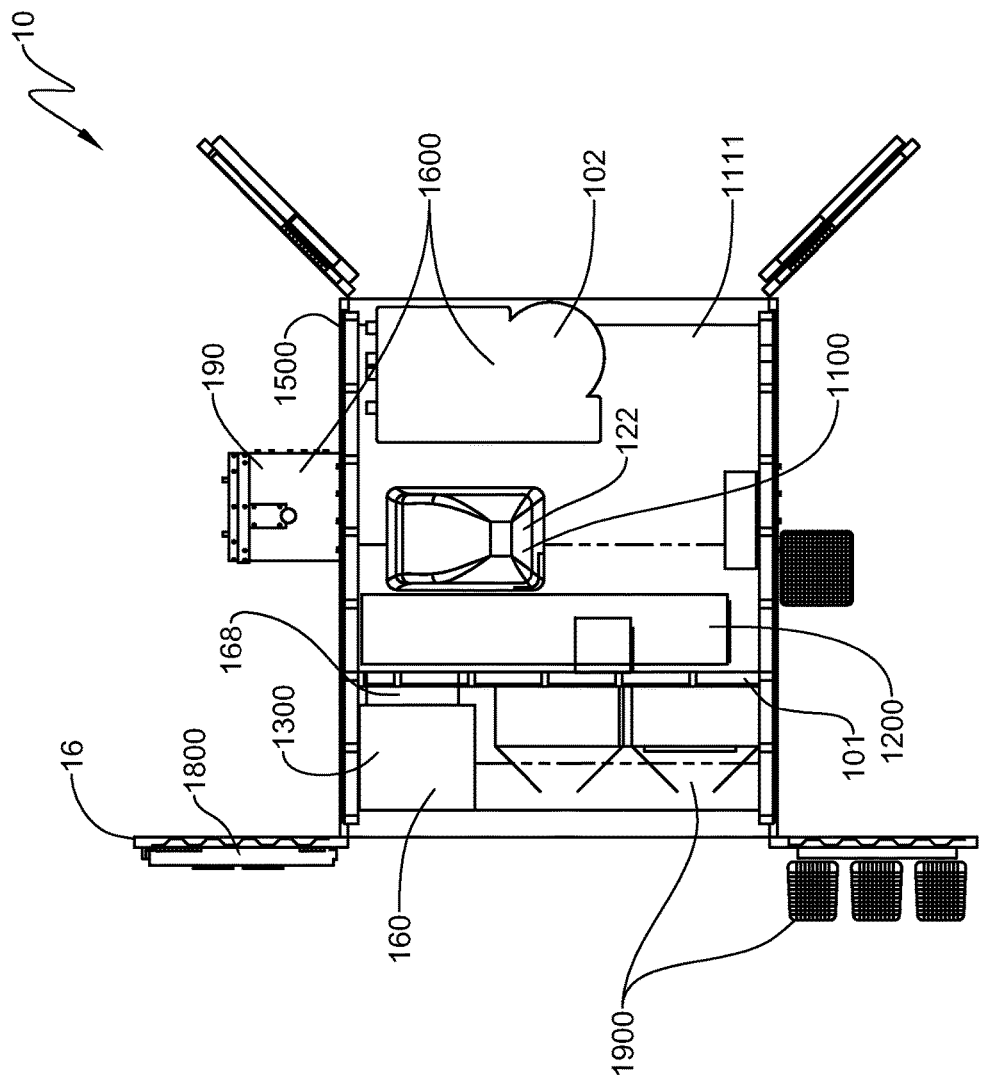
FIG. 22 is a top view of an example modular kiosk for resource distribution in accordance with an embodiment of the present disclosure.

Referring now also to FIG. 22 a top view of an embodiment of a kiosk for resource distribution 10 is shown. As shown, the top of the structure module 1500, radiator 224, product water reservoir 144, and satellite receiver 1802 of the communications module 1800 have been removed in FIG. 22 to allow a clear look at the interior of the structure module 1500 in FIG. 22. As shown, the refrigeration module 1300 and store module 1900 are sectioned off from the rest of the interior of the structure module by a first partitioning wall 101. Also as shown, the TV 300 of the communications module 1800 is located on a door 16 of the structure module 1500. The TV 300 is only viewable when the door 16 is swung open. When closed, the TV 300 is protected by the exterior of the structure module 1500, which in the example embodiment is steel.

Also as shown in FIG. 22, in some embodiments, the refrigeration module 1300 includes a medical refrigeration section 168. As shown, the medical refrigeration section 168 extends into the first portioning wall 101 and is completely segregated from the rest of the refrigerator 160. In the embodiment shown in FIG. 22, the medical refrigeration section 168 is only accessible from the right side of the first partitioning wall 101. The rest of the refrigeration module 1300 is only accessible from the left side of the first partitioning wall 101. This helps to ensure that cross contamination may not occur.

In some embodiments, a battery bank module 1200 may also be included in the kiosk for resource distribution 10 shown in FIG. 22. As shown, the battery bank module 1200 may be placed against the right side of the first partitioning wall 101. As shown, the power module 1600 may include a fuel requiring element 102 which, in some embodiments and as shown in FIG. 22, may be a Stirling engine power generator. In some embodiments, the fuel requiring element 102 may be a different type of power generator. In some embodiments, the power module may not include a fuel requiring element 102. As shown, the power module 1600 may also include at least one oven 190. The oven 190 in some embodiments, projects out of the side of the structure module 1500 and may be heated by waste heat from the fuel requiring element 102 in the example embodiment.

The embodiment of a kiosk for resource distribution 10 in FIG. 22 also includes a water module 1100 as mentioned above. As shown, the water module 1100 may includes a single water device which in the example embodiment is a water distillation device 122. Other embodiments of water modules 1100, such as but not limited to those described above, may include a single water device or two or more water devices. In some embodiments, the water module 1100 may include a single water device because the structure module 1500 is relatively small.

Figure 23:
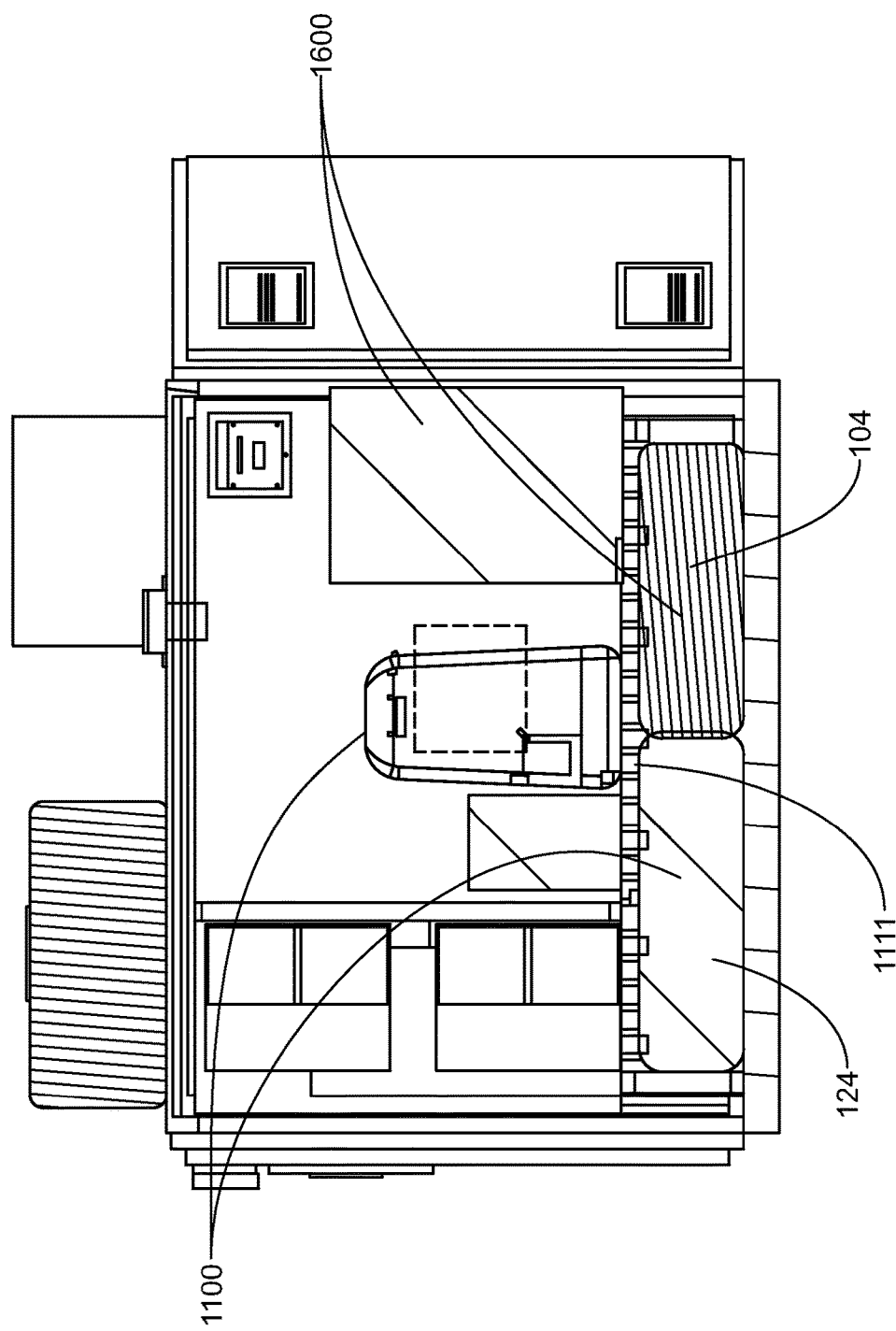
FIG. 23 is cross-sectional view of an example modular kiosk for resource distribution taken at line 23-23 of FIG. 21 in accordance with an embodiment of the present disclosure.

Referring now also to FIG. 23, shows a cross section taken at line 23-23 of the example kiosk for resource distribution 10 shown in FIG. 21 is shown. As shown, the source water reservoir 124 of the water module 1100 may be located under the floor 1111 of the water module 1100. In some embodiments, the floor 1111 of the water module 1100 may extend across the entire length of the kiosk for resource distribution 10. In some embodiments, a fuels storage tank 104 is located under the floor 1111.

Figure 24:
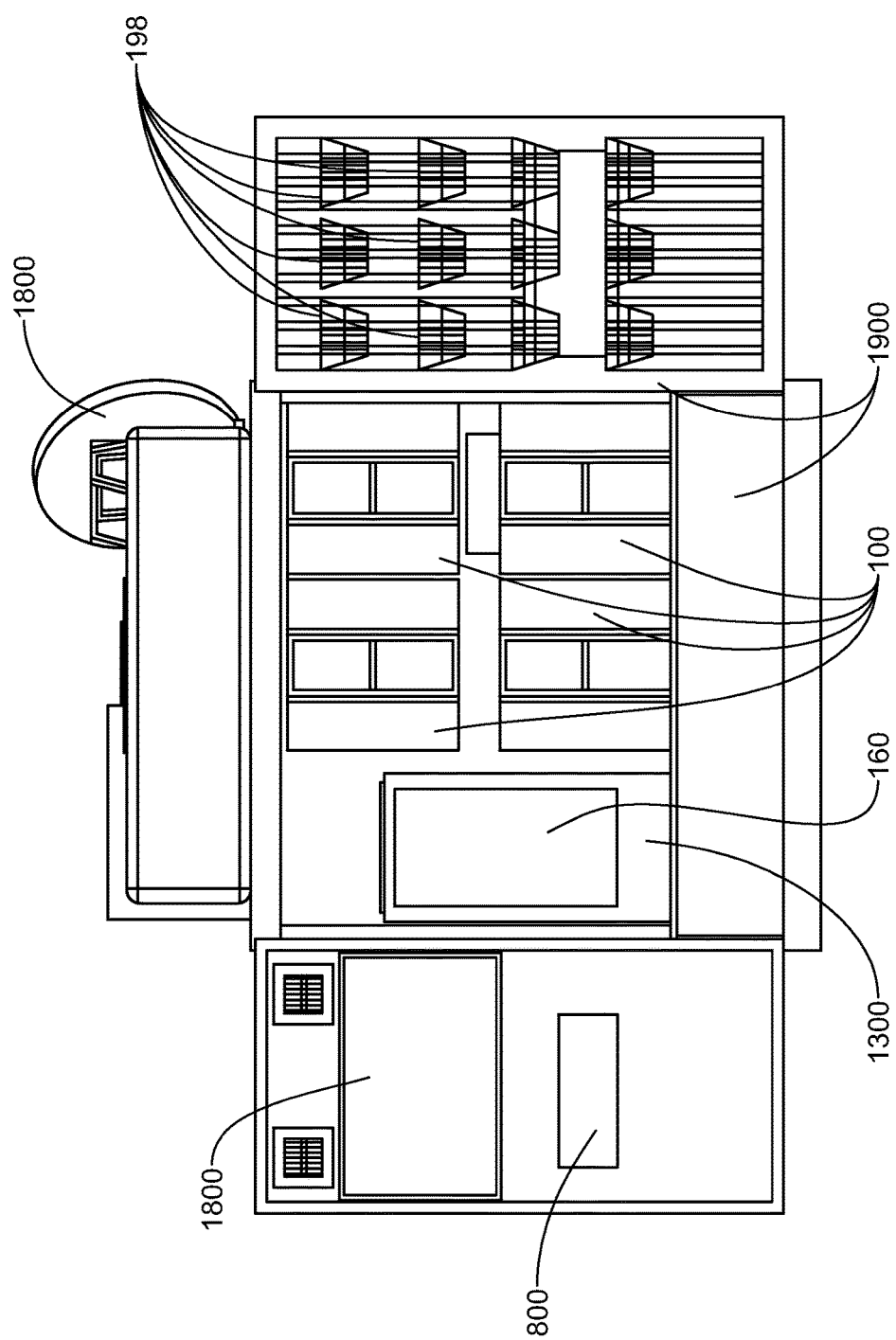
FIG. 24 is a front view of an example modular kiosk for resource distribution in accordance with an embodiment of the present disclosure.

Referring now also to FIG. 24, a front view of an embodiment of a kiosk for resource distribution 10 shown in. Some embodiments include a store module 1900 including shelving/displays 198 and a number of storage areas 100. In some embodiments, the refrigerator 160 of the refrigeration module 1300 may include a transparent front so that products in the refrigerator 160 may be viewed by potential customers. In some embodiments, a charging station 800 may also be included as a part of the store module 1900.

Figure 25:
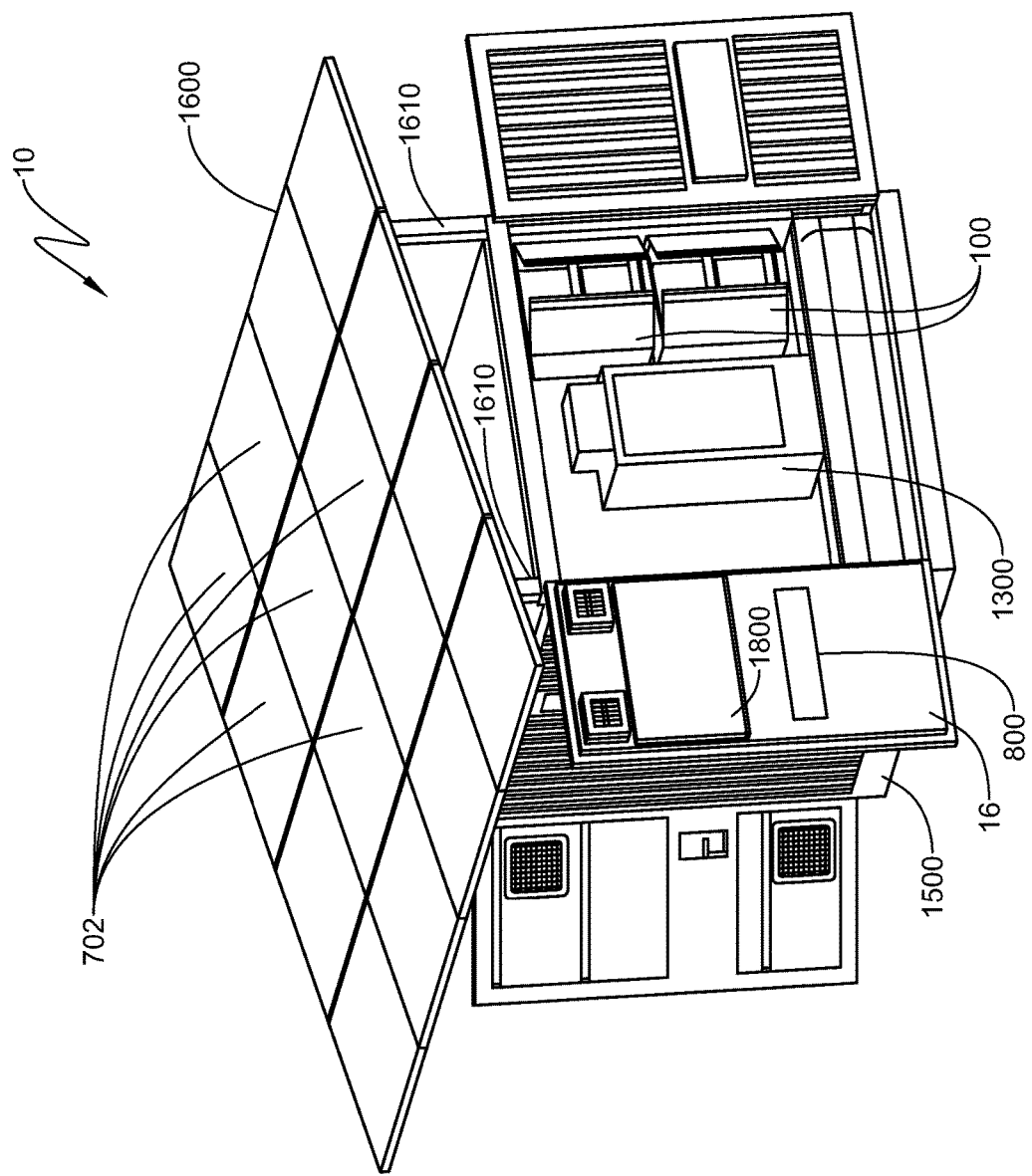
FIG. 25 is an isometric view of yet another modular kiosk for resource distribution in accordance with an embodiment of the present disclosure.

Referring now also to FIG. 25 another embodiment of a kiosk for resource distribution 10 is shown. Some embodiments of the kiosk for resource distribution 10 include a structure module 1500. In some embodiments, the structure module 1500 may be a 10×8×8 foot shipping container. A communication module 1800 and refrigeration module 1300 may also be included in some embodiments. The kiosk for resource distribution 10 may also include a power module 1600. The power module 1600 in some embodiments may not include a fuel requiring element 102 but rather may include one or more solar panels 702. The solar panels 702, in some embodiments, may be disposed above the roof the structure module 1500 and may be held in place by a number of solar panel support beams 1610. In some embodiments, the power module 1600 may include a charging station 800 which may be located on a door 16 of the structure module 1500. One or more storage areas 100 may also be included in some embodiments of the kiosk for resource distribution 10. In some embodiments, the storage areas 100 may be included as an optional component 1002 of the power module 1600. In some embodiments, the storage areas 100 may be used to store rechargeable batteries, rechargeable lighting units, etc. which may be given, sold, or rented to the local population.

Figure 26:
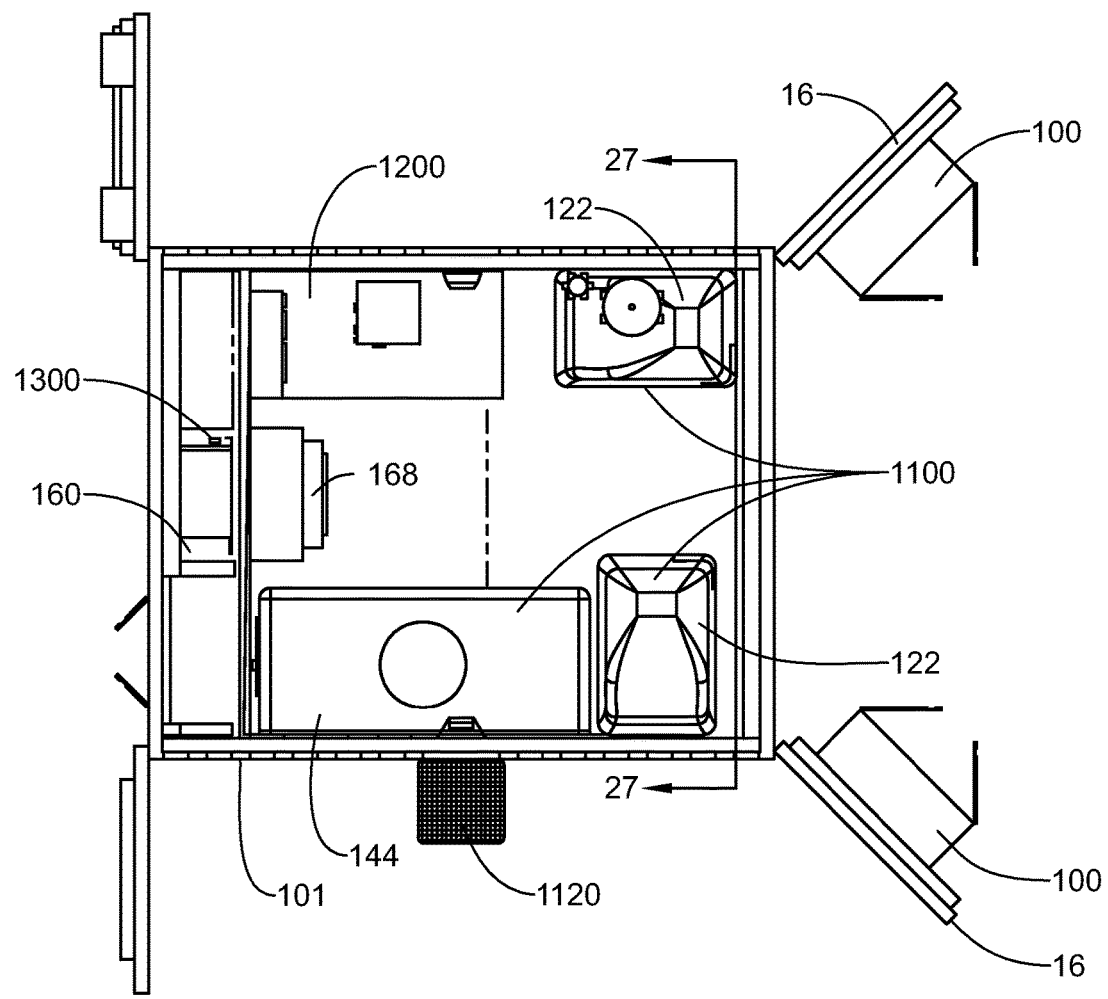
FIG. 26 is a top view of an example embodiment of a modular kiosk for resource distribution in accordance with an embodiment of the present disclosure.

Referring now also to FIG. 26 a top view of the embodiment of a kiosk for resource distribution 10 shown in FIG. 25 is shown. The roof of the structure module 1500, satellite receiver 1802 of the communications module 1800, and the solar panels 702 of the power module 1600 have been removed in FIG. 26 so that the interior layout of the kiosk for resource distribution may be easily seen. In some embodiments, a battery bank module 1200 may be included. In some embodiments, a refrigeration module 1300 extends through a first partitioning wall 101. The refrigerator module 1300 may include a refrigerator 160 and a medical refrigeration section 168. In some embodiments, the medical refrigeration section 168 may be completely segregated from the refrigerator 160, for example, in some embodiments, may be on the opposite side of the first partitioning wall 101 to help prevent cross contamination.

Still referring also to FIG. 26, in some embodiments, the kiosk for resource distribution 10 may also include a water module 1100. In some embodiments, water module 1100 may include a product water reservoir 144. In some embodiments, the water module may also include two (or more) water devices which, in some embodiments, may be water distillation devices 122. Some embodiments include a filling station 1120 in the water module 1100 which may be accessible from the exterior of the structure module 1500. The water module 1100 may include two water devices in some embodiments, for example, in some embodiments where a fuel requiring element 102 is not included, leaving additional space available in the structure module 1500.

Still referring also to FIG. 26, in some embodiments, two storage areas 100 may be coupled to doors 16 on one part of the of the structure module 1500. Such storage areas 100 may be included as an optional component 1002 of a water module 1100 and may be used to store product water containers 940, filters, etc. Some embodiments may include any number of storage areas 100 as part of a storage module.

Figure 27:
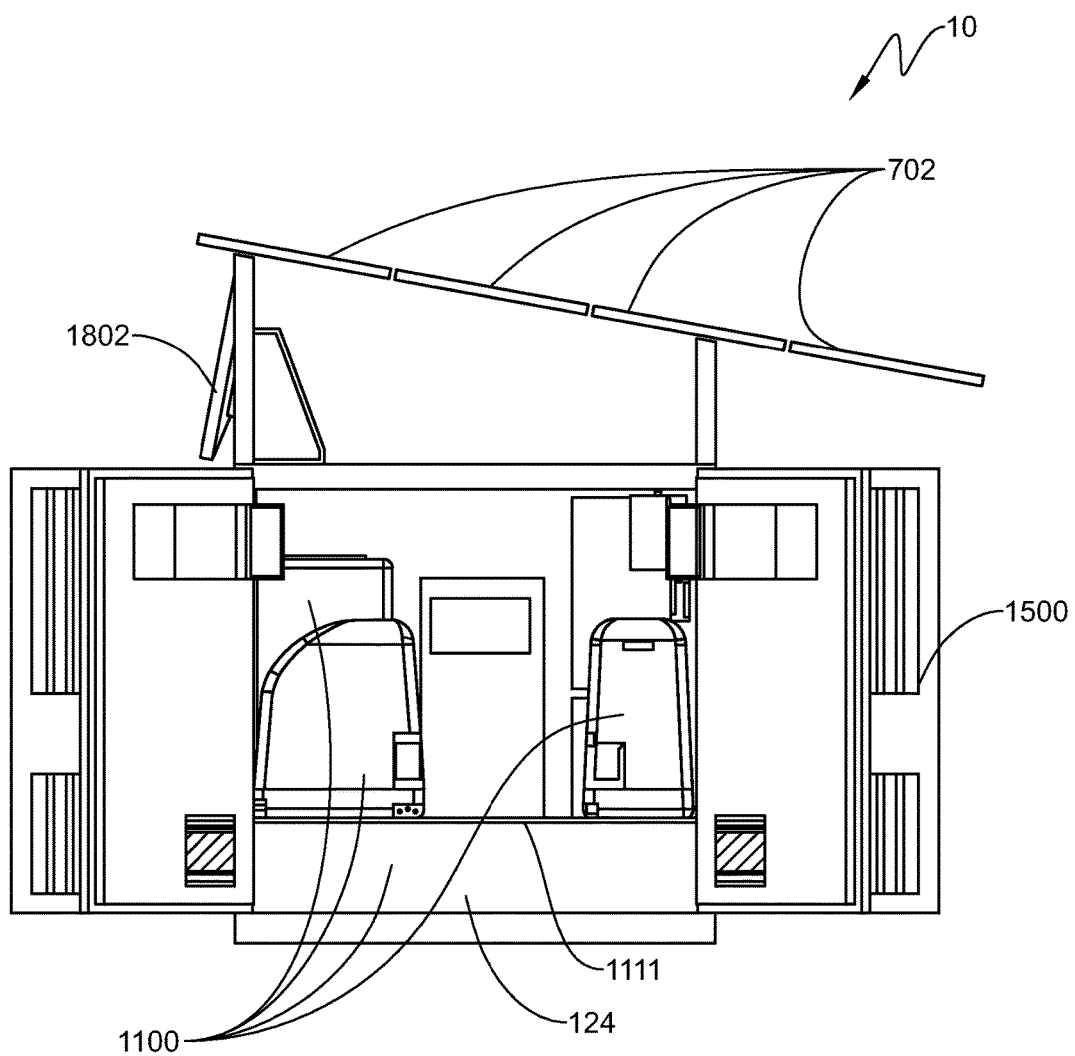
FIG. 27 is a cross-sectional view of an example modular kiosk for resource distribution taken at line 27-27 of FIG. 26 in accordance with an embodiment of the present disclosure.

Referring also to FIG. 27, a cross sectional view taken at line 27-27 of the example kiosk for resource distribution 10 shown in FIG. 26 is shown. In some embodiments the water module 1100 includes a source water reservoir 124. As shown, the source water reservoir 124 may be disposed under the floor 1111 of the water module 1100. In some embodiments, the source water reservoir 124 may be disposed on the roof of the structure module 1500 and/or under the solar panels 702.

Various alternatives and modifications may be devised by those skilled in the art without departing from the disclosure. Accordingly, the present disclosure is intended to embrace all such alternatives, modifications and variances. Additionally, while several embodiments of the present disclosure have been shown in the drawings and/or discussed herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. And, those skilled in the art will envision other modifications within the scope and spirit of the claims appended hereto. Other elements, steps, methods and techniques that are insubstantially different from those described above and/or in the appended claims are also intended to be within the scope of the disclosure.

The embodiments shown in the drawings are presented only to demonstrate certain examples of the disclosure. The drawings described are only illustrative and are non-limiting. In the drawings, for illustrative purposes, the size of some of the elements may be exaggerated and not drawn to a particular scale. Additionally, elements shown within the drawings that have the same numbers may be identical elements or may be similar elements, depending on the context.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Furthermore, the terms "first", "second", "third" and the like, whether used in the description or in the claims, are provided for distinguishing between similar elements and not necessarily for describing a sequential or chronological order. It is to be understood that the terms so used are interchangeable under appropriate circumstances (unless clearly disclosed otherwise) and that the embodiments of the disclosure described herein are capable of operation in other sequences and/or arrangements than are described or illustrated herein.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure.

What is claimed is:

1. A system for the distribution of resources comprising:
   a housing comprising:
   at least one water vapor distillation device for distilling source water into product water;
   at least one power generating device;
   at least one substantially fully enclosed source water reservoir comprising an electric heater configured to heat the at least one source water reservoir;
   a source water conduit coupled to the at least one source water reservoir;
   a source water pump in fluid communication with the source water conduit wherein the source water pump pumps water through the source water conduit and into the source water reservoir;
   at least one product water reservoir configured to receive water from the source water reservoir; and
   at least one energy storage device.

2. The system for the distribution of resources of claim 1 wherein the at least one power generating device is a Stirling generator.

3. The system for the distribution of resources of claim 1 wherein the at least one power generating device is a solar power generating device.

4. The system for the distribution of resources of claim 1 wherein the system for the distribution of resources further comprising a refrigerator.

5. The system for the distribution of resources of claim 4 wherein the refrigerator comprising:
- a general section; and
- a medical refrigeration section, the medical refrigeration section segregated from the rest of the general section.

6. The system for the distribution of resources of claim 1 wherein the system for the distribution further comprising at least one oven.

7. The system for the distribution of resources of claim 6 wherein the oven is heated by waste heat from the power generating device.

8. The system for the distribution of resources of claim 1 wherein the at least one energy storage device is a fuel storage tank.

9. The system for the distribution of resources of claim 1 wherein the at least one energy storage device is a battery bank.

10. The system for the distribution of resources of claim 1 further comprising wherein the power generating device supplies power to an electrical grid.

11. The system for the distribution of resources of claim 1 wherein the system for the distribution of resources further comprising at least one communications tower.

12. The system for the distribution of resources of claim 1 further comprising a charging station configured to charge at least one portable power source.

13. A system for the distribution of resources comprising:
- a housing comprising:
  - a first compartment, the first compartment comprising:
    - a substantially fully enclosed source water reservoir; and
    - an electric heater configured to heat the source water reservoir;
  - at least one water vapor distillation device for distilling source water into product water, the water vapor distillation device in fluid communication with the source water reservoir and a product water reservoir;
  - a source water conduit coupled to the source water reservoir; and
  - a source water pump in fluid communication with the source water conduit wherein the source water pump pumps water through the source water conduit and into the source water reservoir;
- a second compartment, the second compartment comprising at least one fuel requiring element providing electrical power to the at least one water vapor distillation device;
- at least one refrigeration apparatus;
- at least one oven, wherein the at least one oven connected to the fuel requiring element wherein the waste heat from the fuel requiring element is transferred to the at least one oven; and
- a fuel reservoir in fluid communication with the fuel requiring element.

14. The system for the distribution of resources of claim 13 wherein the at least one fuel requiring element is a Stirling generator.

15. The system for the distribution of resources of claim 13 further comprising at least one energy storage device.

16. The system for the distribution of resources of claim 15 wherein the at least one energy storage device is a battery bank.

17. The system for the distribution of resources of claim 13 further comprising at least one solar panel.

18. The system for the distribution of resources of claim 13 wherein the system for the distribution of resources further comprising at least one communications tower.

19. The system for the distribution of resources of claim 13 further comprising a charging station configured to charge at least one portable power source.

* * * * *